(12) United States Patent
Far

(10) Patent No.: US 10,832,014 B1
(45) Date of Patent: Nov. 10, 2020

(54) MULTI-QUADRANT ANALOG CURRENT-MODE MULTIPLIERS FOR ARTIFICIAL INTELLIGENCE

(71) Applicant: Ali Tasdighi Far, San Jose, CA (US)

(72) Inventor: Ali Tasdighi Far, San Jose, CA (US)

(*) Notice: Subject to any disclaimer, the term of this patent is extended or adjusted under 35 U.S.C. 154(b) by 0 days.

(21) Appl. No.: 16/731,006

(22) Filed: Dec. 30, 2019

Related U.S. Application Data

(63) Continuation-in-part of application No. 16/381,245, filed on Apr. 11, 2019, now Pat. No. 10,594,334, and a continuation-in-part of application No. 16/266,083, filed on Feb. 3, 2019, now Pat. No. 10,581,448.

(60) Provisional application No. 62/927,285, filed on Oct. 29, 2019, provisional application No. 62/912,407, filed on Oct. 8, 2019, provisional application No. 62/880,885, filed on Jul. 31, 2019, provisional application No. 62/865,845, filed on Jun. 24, 2019, provisional application No. 62/862,772, filed on Jun. 18, 2019, provisional application No. 62/856,889, filed on Jun. 4, 2019, provisional application No. 62/677,150, filed on May 28, 2018, provisional application No. 62/658,678, filed on Apr. 17, 2018.

(51) Int. Cl.
*H03M 1/12* (2006.01)
*G06G 7/12* (2006.01)
*H03M 1/00* (2006.01)
*H03K 19/20* (2006.01)

(52) U.S. Cl.
CPC ............ *G06G 7/12* (2013.01); *H03M 1/001* (2013.01); *H03K 19/20* (2013.01)

(58) Field of Classification Search
CPC .......... G06G 7/12; H03M 1/001; H03K 19/20

USPC ......................................... 341/155, 144, 150
See application file for complete search history.

(56) References Cited

U.S. PATENT DOCUMENTS 2,920,828 A    1/1960   Davis
3,013,724 A    12/1961  Thompson et al.
(Continued)

OTHER PUBLICATIONS

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.
(Continued)

*Primary Examiner* — Peguy Jean Pierre

(57) ABSTRACT

Analog multipliers circuits can provide signal processing asynchronously and clock free and with low power consumptions, which can be advantageous, including in emerging mobile, portable, and at edge or near sensor artificial intelligence (AI) and machine learning (ML) applications. As such, analog multipliers can process signals memory-free in AI and ML applications, which avoids the power consumption and latency delays attributed to memory read-write cycles in conventional AI and ML digital processors. Based on standard digital Complementary-Metal-Oxide-Semiconductor (CMOS) manufacturing process, the present invention discloses embodiments of multi-quadrant current-mode analog multiplier (iMULT) circuits that can be utilized in current-mode multiply-accumulate (iMAC) circuits and artificial neural network (ANN) end-applications that require high-volumes, low costs, medium precision, low power consumptions, and clock free asynchronous signal processing.

10 Claims, 14 Drawing Sheets

(56) References Cited

U.S. PATENT DOCUMENTS

| | | |
|---|---|---|
| 3,084,862 A | 4/1963 | Nathan |
| 3,102,951 A | 9/1963 | Nathan |
| 3,106,639 A | 10/1963 | Nathan |
| 3,120,605 A | 2/1964 | Nathan et al. |
| 3,197,626 A | 7/1965 | Platzer et al. |
| 3,253,135 A | 5/1966 | Collings et al. |
| 3,261,971 A | 7/1966 | Nathan |
| 3,296,429 A | 1/1967 | Nathan |
| 3,304,419 A | 2/1967 | Huntley, Jr. et al. |
| 3,453,423 A | 7/1969 | Ma |
| 3,536,904 A | 10/1970 | Jordan, Jr. et al. |
| 3,562,553 A | 2/1971 | Roth |
| 3,621,226 A | 11/1971 | Wittlinger |
| 3,633,005 A | 1/1972 | Leighton |
| 3,683,165 A | 8/1972 | Grobert et al. |
| 3,689,752 A | 9/1972 | Gilbert |
| 3,838,262 A | 9/1974 | Van De Plassche |
| 3,940,603 A | 2/1976 | Smith |
| 3,956,643 A | 5/1976 | Hite |
| 4,001,602 A | 1/1977 | Birchenough |
| 4,004,141 A | 1/1977 | Curtis |
| 4,017,720 A | 4/1977 | Mattern |
| 4,071,777 A | 1/1978 | Herrmann |
| 4,101,966 A | 7/1978 | Uzunoglue |
| 4,156,283 A | 5/1979 | Gilbert |
| 4,308,471 A | 12/1981 | Misawa |
| 4,353,000 A | 10/1982 | Noda |
| 4,387,439 A | 6/1983 | Lin |
| 4,482,977 A | 11/1984 | Ross |
| 4,546,275 A | 10/1985 | Pena-Finol et al. |
| 4,572,975 A | 2/1986 | Bowers |
| 4,586,155 A | 4/1986 | Gilbert |
| 4,677,369 A | 6/1987 | Bowers et al. |
| 4,752,900 A | 6/1988 | Wynne |
| 4,827,260 A | 5/1989 | Sugawa et al. |
| 4,999,521 A | 3/1991 | Rusznyak |
| 5,107,150 A | 4/1992 | Kimura |
| 5,122,687 A | 6/1992 | Schmidt |
| 5,157,350 A | 10/1992 | Rubens |
| 5,254,889 A | 10/1993 | Han |
| 5,283,579 A | 2/1994 | Tasdighi |
| 5,294,927 A | 3/1994 | Levinson et al. |
| 5,381,352 A | 1/1995 | Shou et al. |
| 5,389,840 A | 2/1995 | Dow |
| 5,495,245 A | 2/1996 | Ashe |
| 5,602,504 A | 2/1997 | Liu |
| 5,619,444 A | 4/1997 | Agranat et al. |
| 5,640,084 A | 6/1997 | Tero et al. |
| 5,656,964 A | 8/1997 | Liu |
| 5,668,710 A | 9/1997 | Caliboso et al. |
| 5,703,588 A | 12/1997 | Rivoir et al. |
| 5,734,260 A | 3/1998 | Tasdighi et al. |
| 5,734,291 A | 3/1998 | Tasdighi et al. |
| 5,760,726 A | 6/1998 | Koifman et al. |
| 5,801,655 A | 9/1998 | Imamura |
| 5,805,007 A | 9/1998 | Colli |
| 5,814,995 A | 9/1998 | Tasdighi |
| 5,831,566 A | 11/1998 | Ginetti |
| 5,862,069 A | 1/1999 | Nestler |
| 5,864,255 A | 1/1999 | Kwok et al. |
| 5,870,049 A | 2/1999 | Huang et al. |
| 5,912,834 A | 6/1999 | Kimura |
| 5,923,208 A | 7/1999 | Tasdighi et al. |
| 5,966,040 A | 10/1999 | Gai et al. |
| 5,969,658 A | 10/1999 | Naylor |
| 6,005,374 A | 12/1999 | Tasdighi |
| 6,052,074 A | 4/2000 | Iida |
| 6,054,823 A | 4/2000 | Collings et al. |
| 6,072,415 A | 6/2000 | Cheng |
| 6,122,284 A | 9/2000 | Tasdighi et al. |
| 6,225,929 B1 | 5/2001 | Beck |
| 6,243,033 B1 | 6/2001 | Mizuno |
| 6,384,763 B1 | 5/2002 | Leung et al. |
| 6,392,574 B1 | 5/2002 | Toosky |
| 6,424,283 B2 | 7/2002 | Bugeja et al. |
| 6,489,905 B1 | 12/2002 | Lee et al. |
| 6,507,304 B1 | 1/2003 | Lorenz |
| 6,542,098 B1 | 4/2003 | Casper et al. |
| 6,563,365 B2 | 5/2003 | Knierim et al. |
| 6,583,744 B2 | 6/2003 | Bright |
| 6,982,588 B1 | 1/2006 | Lin et al. |
| 7,024,448 B2 | 4/2006 | Matsugaki et al. |
| 7,136,002 B2 | 11/2006 | Dempsey et al. |
| 7,197,292 B1 | 3/2007 | Kouwenhoven et al. |
| 7,312,740 B2 | 12/2007 | Chou |
| 7,702,716 B2 | 4/2010 | Rösener |
| 8,610,486 B1 | 12/2013 | Al-Absi et al. |
| 9,069,995 B1 | 6/2015 | Cronie |
| 9,519,304 B1 | 12/2016 | Far |
| 9,780,652 B1 | 10/2017 | Far |
| 9,793,912 B1 | 10/2017 | Ferris et al. |
| 9,921,600 B1 | 3/2018 | Far |
| 10,177,713 B1 | 1/2019 | Far |
| 10,198,022 B1 | 2/2019 | Far |
| 10,411,597 B1 | 9/2019 | Far |
| 10,491,167 B1 | 11/2019 | Far |
| 10,536,117 B1 | 1/2020 | Far |
| 10,581,448 B1* | 3/2020 | Far .................. H03M 1/447 |
| 10,594,334 B1* | 3/2020 | Far .................. H03M 1/466 |
| 2001/0026236 A1 | 10/2001 | Toda |
| 2003/0184338 A1 | 10/2003 | Comer et al. |
| 2004/0183706 A1 | 9/2004 | Brauns et al. |
| 2006/0170580 A1 | 8/2006 | Lauritzen et al. |
| 2008/0036523 A1 | 2/2008 | Nijrolder |
| 2009/0045993 A1 | 2/2009 | Tokumaru et al. |
| 2009/0184855 A1 | 7/2009 | Tokumaru et al. |
| 2010/0072821 A1 | 3/2010 | Ramaguchi et al. |
| 2010/0283642 A1 | 11/2010 | Lai et al. |
| 2014/0043087 A1 | 2/2014 | Li et al. |
| 2015/0091784 A1 | 4/2015 | Kwon et al. |
| 2015/0123724 A1 | 5/2015 | Al-Absi et al. |
| 2016/0248437 A1 | 8/2016 | Zhang et al. |
| 2018/0174021 A9* | 6/2018 | Lal .................. G06K 9/0002 |
| 2019/0332459 A1* | 10/2019 | Schie .................. G06F 11/0751 |

OTHER PUBLICATIONS

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5μW fractional CMOS bandgap voltage and current reference," 2013 IEEE Global High Tech Congress on Electronics, Shenzhen, 2013, pp. 7-11.

A. Far, "A 400nW CMOS bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

A. Far, "Subthreshold bandgap voltage reference aiming for energy harvesting: 100na, 5 ppm/c, 40 ppm/v, psrr -88db," 2015 IEEE 5th International Conference on Consumer Electronics—Berlin (ICCE-Berlin), Berlin, 2015, pp. 310-313.

(56) References Cited

OTHER PUBLICATIONS

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2μW half bandgap reference in standard sub-μ CMOS," 2014 IEEE International Conference on Electronics, Computing and Communication Technologies (CONECCT), Bangalore, 2014, pp. 1-5.

A. Far, "Current reference for energy harvesting: 50um per side, At 70 nW, regulating to 125C," 2014 IEEE International Autumn Meeting on Power, Electronics and Computing (ROPEC), Ixtapa, 2014, pp. 1-5.

\* cited by examiner

US 10,832,014 B1

MULTI-QUADRANT ANALOG CURRENT-MODE MULTIPLIERS FOR ARTIFICIAL INTELLIGENCE

CROSS-REFERENCE TO RELATED PATENT APPLICATIONS

The present disclosure claims priority from U.S. Provisional Patent Application Ser. No. 62/865,845 filed Jun. 24, 2019 and which is herein specifically incorporated by reference in its entirety. Furthermore, the present disclosure claims priority from U.S. Provisional Patent Application Ser. No. 62/856,889 filed Jun. 4, 2019 and which is herein specifically incorporated by reference in its entirety. Furthermore, the present disclosure claims priority from U.S. Provisional Patent Application Ser. No. 62/880,885 filed Jul. 31, 2019 and which is herein specifically incorporated by reference in its entirety. Furthermore, the present disclosure claims priority from U.S. Provisional Patent Application Ser. No. 62/912,407 filed Oct. 8, 2019 and which is herein specifically incorporated by reference in its entirety. Furthermore, the present disclosure claims priority from U.S. Provisional Patent Application Ser. No. 62/862,772 filed Jun. 18, 2019 and which is herein specifically incorporated by reference in its entirety. Furthermore, the present disclosure claims priority from U.S. Provisional Patent Application Ser. No. 62/927,285 filed Oct. 29, 2019 and which is herein specifically incorporated by reference in its entirety. Furthermore, the present invention is a continuation-in-part of and claims the benefit of priority from U.S. patent application Ser. No. 16/266,083 filed on Feb. 3, 2019 which claims priority from U.S. Provisional Patent Application Ser. No. 62/677,150, filed on May 28, 2018, and which are herein specifically incorporated by reference in their entirety. Furthermore, the present invention is a continuation-in-part of and claims the benefit of priority from U.S. patent application Ser. No. 16/381,245 filed on Apr. 11, 2019 which claims priority from U.S. Provisional Patent Application Ser. No. 62/658,678, filed on Apr. 17, 2018, and which are herein specifically incorporated by reference in their entirety.

FIELD OF DISCLOSURE

This disclosure relates to improvements in analog and mixed-signal current-mode multipliers (iMULT) and in analog and mixed-signal current-mode multiply-accumulate (MAC) circuits.

BACKGROUND

Multiplication and multiply-accumulate functions are fundamental in signal processing, including in artificial intelligence and machine learning (AI & ML) applications. Approximate computing, which can be performed in analog can provide lower power consumption, smaller die size, and asynchronous signal processing which frees computation from read-write cycles to and from memory. These traits are beneficial in some portable, mobile, at edge, and near sensors in AI & ML applications where low cost, high volume, low latency, privacy of data-flow, low power consumption, and clock free asynchronous operations may be required.

An objective of the present disclosure is to provide iMULT and current-mode multiply-accumulate (iMAC) circuits that are small and low cost. Small size and low cost are especially important in high-volume AI & ML applications that may require a plurality of iMULT and or iMAC on the same IC.

Another objective of the present disclosure is to provide iMULT and iMAC circuits that have low current consumption. As noted, low current consumption is critical in AI & ML applications that run on battery and may require a plurality of iMULT and or iMAC on the same IC.

Another objective of the present disclosure is to provide iMULT and iMAC circuits that run asynchronously, which frees signal processing function from always-running clocks, the related digital-clock dynamic power consumption, and the noise related to free running clocks.

Another objective of the present disclosure is to provide iMULT and iMAC circuits that run asynchronously that frees the computation from read-write cycles to and from memory, which reduces dynamic power consumption and reduces memory area on chip.

Another objective of the present disclosure is to provide iMULT and iMAC circuits that can be manufactured in main-stream Complementary-Metal-Oxide-Semiconductor (CMOS) fabrication manufacturing that is low cost, readily available at foundries, with proven track record and rugged manufacturing quality.

Another objective of the present disclosure is to provide iMULT and iMAC circuits, which facilitates zero-scale and full-scale signal spans while the chip operates with low power supplies, which is advantageous in portable applications.

Another objective of the present disclosure is to provide iMULT and iMAC circuits that can be operate with low power supplies, which helps lowering the power consumption further.

Another objective of the present disclosure is to provide iMULT and iMAC circuits in CMOS, wherein the CMOS transistors operate in the subthreshold regions, which helps lowering the power consumption further and reduces the operating power supply.

Another objective of the present disclosure is to provide iMULT and iMAC circuits that utilize substrate vertical Bipolar-Junction-Transistors (BJT) that are available parasitically and at no extra cost in digital CMOS manufacturing. Further objective of the present disclosure is to utilize such BJT in order to operate an iMULT at high-to-low input currents, and to remove the CMOS subthreshold (ultra-low current) operating restrictions from the iMULT and accordingly to facilitate arranging the iMULT in an iMAC that also utilizes such BJTs.

Another objective of the present disclosure is to provide iMULT and iMAC circuits wherein post or pre multiplication functions, such as addition or subtraction, can take small area (e.g., addition of two current signals requires just the coupling of two signals). This trait enables preforming the addition and or subtraction functions also in current-mode which is inherently fast.

Another objective of the present disclosure is to provide iMULT and iMAC circuits without using any resistors or capacitors, which reduces manufacturing size and cost for signal processing in AI & ML end-applications.

Another objective of the present disclosure is to provide iMULT and iMAC circuits which are symmetric, matched, and scaled. Such arrangement facilitates device parameters in fabrication to track each other over process, temperature, and operating conditions variations. Accordingly, temperature coefficient, power supply coefficient, and AC power supply rejection performance of multipliers (and iMACs that utilize such multiplier) for AI & ML applications can be improved.

Another objective of the present disclosure is to provide iMULT and iMAC circuits that facilitates approximate computation that is asynchronous, consumes low power, and has small size. Moreover, the objective here is to leverage the trade off in analog processing between low power and analog accuracy degradation, but not total failures. This trait can provide the AI & ML end-application with approximate results to work with, instead of experiencing failed results.

Another objective of the present disclosure is to provide iMULT and iMAC circuits that take advantage of attenuated contribution of component's random errors in a summation node. Plurality of analog signals that are summed at inputs or outputs of an iMULT (to arrange an analog iMAC) would attenuate the statistical contribution of such cumulative analog signal random errors (such as random noise, offset, mismatches, linearity, gain, drift, etc.) at the summing nodes where plurality of analog iMULT's currents are coupled. The statistical contribution of such cumulative analog signal random errors, at the summing node, is generally the square root of the sum of the squares of such random error terms.

Another objective of the present disclosure is to provide iMULT and iMAC circuits for AI and ML applications that can process information at or near edge and sensors that improves privacy, instead of sending information on the cloud.

Another objective of the present disclosure is to provide iMULT and iMAC circuits that run asynchronously that reduces latency and provides real-time computation.

SUMMARY OF THE DISCLOSURE

Figures 1A, 1B, 1C:
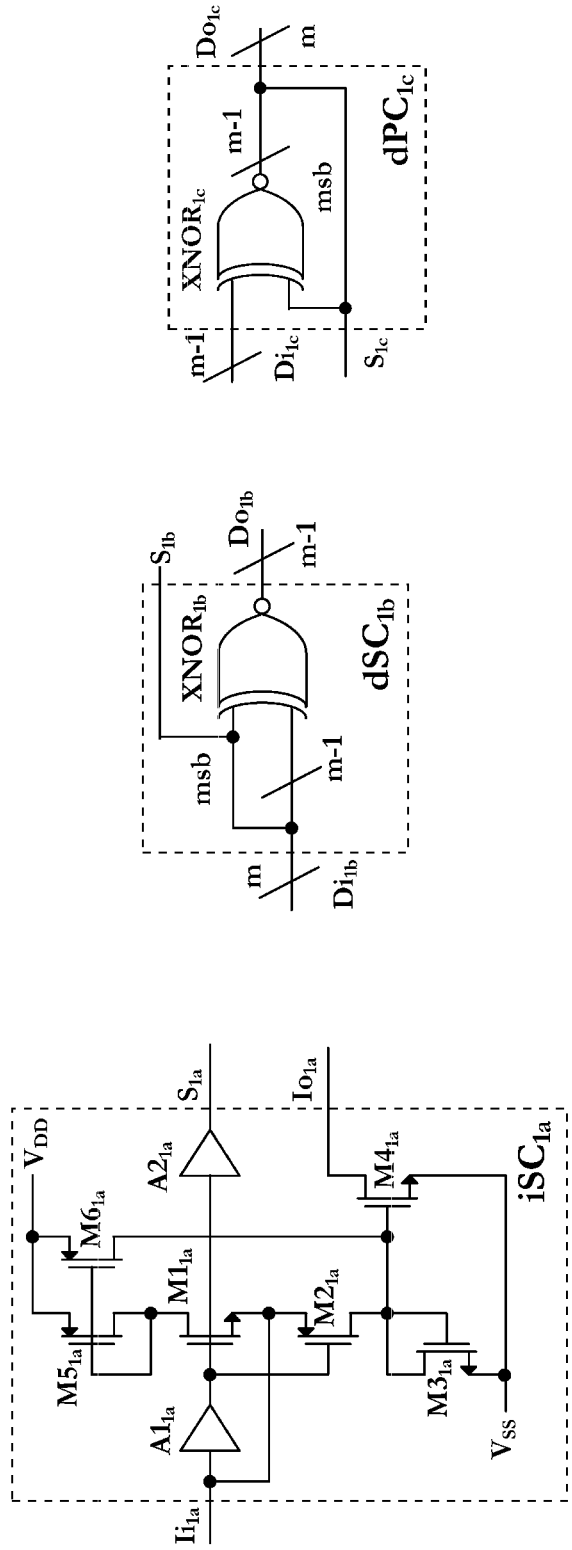
FIG. 1A is a simplified circuit schematic illustrating an analog current-mode signal conditioning ($iSC_{1a}$) circuit.
FIG. 1B is a simplified circuit schematic illustrating a digital signal conditioning ($dSC_{1b}$) circuit.
FIG. 1C is a simplified circuit schematic illustrating a digital polarity conditioning ($dPC_{1c}$) circuit.

An aspect of the present disclosure is a mixed-signal multi-quadrant data-converter (qDC) method in an integrated circuit, the qDC method comprising: converting a bipolar signal ($\pm E$) to a unipolar signal ($|E|$), wherein the $|E|$ is generated by a signal conditioner (SC) circuit; generating a sign signal (eS) indicating the polarity of the $\pm E$, wherein the eS is generated by the SC circuit; converting the $|E|$ to another form of a unipolar signal ($|E'|$), wherein the $|E'|$ is generated by a single-quadrant Data-Converter (DC); and converting the $|E'|$ to another form of a bipolar signal ($\pm E'$), wherein the $\pm E'$ is generated by a polarity conditioning circuit (PC), and wherein the polarity of $\pm E'$ signal is programmed by the eS. The mixed-signal multi-quadrant data-converter (qDC) method in an integrated circuit, the qDC method further comprising: wherein the single-quadrant DC is at least one of a Digital-to-Analog Converter (DAC) and an Analog-to-Digital Converter (ADC). The mixed-signal multi-quadrant data-converter (qDC) method in an integrated circuit, the qDC method further comprising: operating the single-quadrant DC in current mode. The mixed-signal multi-quadrant data-converter (qDC) meth in an integrated circuit, the qDC method further comprising wherein if $|E|$ is an analog signal, then $|E'|$ is a digital signal, and wherein if $|E'|$ is an analog signal, then $|E|$ is a digital signal. The mixed-signal multi-quadrant data-converter (qDC) method in an integrated circuit, the qDC method further comprising: wherein the SC circuit is at least one of a full-wave rectifier circuit and an absolute-value circuit.

An aspect of the present disclosure is a mixed-signal multi-quadrant multiplier (qMULT) method in an integrated circuit, the qMULT method comprising: converting an E bipolar signal ($\pm E$) to an E unipolar signal ($|E|$), wherein the $|E|$ is generated by a signal conditioner (SCE) circuit; generating an E sign signal (eS) indicating the polarity of the $\pm E$, wherein the eS signal is generated by the SCE circuit; converting an F bipolar signal ($\pm F$) to an F unipolar signal (|F|), wherein the |F| is generated by a signal conditioner (SCF) circuit; generating an F sign signal (fS) indicating the polarity of the ±F, wherein the fS signal is generated by the SCF circuit; multiplying |E| by |F| as a ratio of a unipolar reference signal (G) to generate a unipolar product signal (|E|×|F|/G), wherein the |E|×|F|/G signal is generated by a single-quadrant multiplier; and converting the |E|×|F|/G to a bipolar multi-quadrant product signal (±|E|×±|F|/G), wherein the ±|E|×±|F|/G signal is generated by a polarity conditioning (PC) circuit wherein the polarity of ±|E|×±|F|/G signal is accomplished by programming the PC circuit with the eS and fS signals. The mixed-signal multi-quadrant multiplier (qMULT) method in an integrated circuit, the qMULT method further comprising: wherein the single-quadrant multiplier is a single-quadrant analog multiplier. The mixed-signal multi-quadrant multiplier (qMULT) method in an integrated circuit, the qMULT method further comprising: wherein the single-quadrant analog multiplier operates in current mode. The mixed-signal multi-quadrant multiplier (qMULT) method in an integrated circuit, the qMULT method further comprising: wherein the single-quadrant multiplier utilizes a single-quadrant Digital-to-Analog Converter (DACE), wherein DACE's output is inputted to a reference port of a single quadrant Digital-to-Analog Converter (DACF). The mixed-signal multi-quadrant multiplier (qMULT) method in an integrated circuit, the qMULT method further comprising: wherein the single-quadrant DACE and DACF operates in current mode. The mixed-signal multi-quadrant multiplier (qMULT) method of in an integrated circuit, the qMULT method further comprising: wherein the single-quadrant multiplier utilizes a single-quadrant Analog-to-Digital Converter (ADCE), wherein ADCE's output is inputted to a digital input port of a single quadrant Digital-to-Analog Converter (DACF). The mixed-signal multi-quadrant multiplier (qMULT) method in an integrated circuit, the qMULT method further comprising: wherein the single-quadrant ADCE and DACF operates in current mode. The mixed-signal multi-quadrant multiplier (qMULT) method in an integrated circuit, the qMULT method further comprising: wherein the single-quadrant Data-Converters (DC) is a current-mode Data-Converter (iDC). The mixed-signal multi-quadrant multiplier (qMULT) method of claim 6 in an integrated circuit, the qMULT method further comprising: Wherein the SCE circuit is at least one of full-wave rectifier circuit and an absolute-value circuit.

An aspect of the present disclosure is a mixed-signal multi-quadrant scalar multiplier (SqMULT) method in an integrated circuit, the SqMULT method comprising: converting a scalar E bipolar signal (±E) to a scalar E unipolar signal (|E|), wherein the |E| is generated by a scalar E signal conditioner (SCE) circuit; generating a scalar E sign signal (eS) indicating the polarity of the scalar ±E, wherein the eS is generated by the scalar SCE circuit; converting a plurality of F bipolar signals (±pF) to a plurality of F unipolar signals (|pF|), wherein the |pF| is respectively generated by a plurality of F signal conditioners (pSCF) circuits; generating a plurality of F sign signals (pfS) indicating the polarity of the plurality of ±Fs, wherein pfS is respectively generated by the plurality of the pSCF circuits; multiplying |E| by the plurality of |pF| as a ratio of a unipolar reference signal (G) to generate a plurality of scaled unipolar product signals (|E|×|pF|/G), wherein the |E|×|pF|/G is respectively generated by a plurality of single-quadrant multipliers; converting the plurality of |E|×|pF|/G to a plurality of scaled bipolar multi-quadrant product signals (±|E|×±|pF|/G) utilizing respectively a plurality of polarity conditioning circuits (pPC), wherein the eS and the respective plurality of p f S program the polarity of the pPCs, and wherein the pPCs generate the respective plurality of the ±|E|×±|pF|/G. The mixed-signal multi-quadrant scalar multiplier (SqMULT) method in an integrated circuit, the SqMULT method further comprising: wherein the plurality of single-quadrant multipliers utilize a plurality of single-quadrant Data-Converters (pDC). The mixed-signal multi-quadrant scalar multiplier (SqMULT) method in an integrated circuit, the SqMULT method further comprising: wherein the pDCs operate in current mode. The mixed-signal multi-quadrant scalar multiplier (SqMULT) method in an integrated circuit, the SqMULT method further comprising: wherein the plurality of SCF circuit is at least one of a plurality of full-wave rectifier circuits and a plurality of absolute-value circuits. The mixed-signal multi-quadrant scalar multiplier (SqMULT) method in an integrated circuit, the SqMULT method further comprising: wherein the plurality of single-quadrant multipliers utilize a plurality of single-quadrant analog multipliers (pMULT). The mixed-signal multi-quadrant scalar multiplier (SqMULT) method of claim 15 in an integrated circuit, the SqMULT method further comprising: wherein the pMULTs operate in current mode.

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Note that all the figures comprised of circuits, blocks, or systems illustrated in this disclosure are powered up by positive power supply $V_{DD}$ and negative power supply $V_{SS}$, wherein $V_{SS}$ can be connected to the ground potential or zero volts. A bipolar signal is one that spans across two polarities (e.g., bipolar signal represents a signal that spans between positive and negative ranges). A unipolar signal is one that spans across one polarity (e.g., unipolar signal represents a signal that spans between positive and zero ranges). Terms FET is Field-Effect-Transistor; MOS is Metal-Oxide-Semiconductor. MOSFET is MOS FET. PMOS is P-channel or P-type MOS. NMOS is N-channel or N-type MOS. BiCMOS is Bipolar CMOS. The term BJT is Bipolar-Junction Transistor. The terms 'port' or 'terminal' are used interchangeably throughout this disclosure. The terms 'power supply voltage' or 'supply voltage' are used interchangeably throughout this disclosure. The body terminal of NMOSFET can be connected to its source terminal of NMOSFET or to $V_{SS}$, throughout this disclosure. Additionally, the body terminal of PMOSFET can be connected to the source terminal of PMOSFET or to $V_{DD}$ throughout this disclosure. The term $V_{GS}$ or $v_{GS}$ are gate-to-source voltage for a MOSFET. The term $V_{DS}$ is drain-to-source voltage for a MOSFET. The term $I_{DS}$ or $I_D$ is drain current of a MOSFET (e.g., also $I_{M1}$ or $Id_{M1}$, or $I_{D_{M1}}$ is drain current of $M_1$ that is a MOSFET, or $I_{MF1_{5a}}$ is drain current of $MF1_{5a}$ which is a FET referred to as MF1 in FIG. 5A). The term $V_{BE}$ or $v_{BE}$ is base-to-emitter voltage of a BJT. The term $I_C$ is collector current of a BJT and $I_E$ Is emitter current of a BJT (e.g., also $Ie_{Q1}$ or $Ic_{q1}$ or $I_{CE_{Q1}}$ is a current of $Q_1$ wherein $Q_1$ is a BJT). Channel width over channel length is W/L which is the size of a MOSFET. This disclosure utilizes transistors (T) whose input-voltage ($v_I$) to output-current ($i_O$) transfer function approximately follows an exponential profile. The term MSB is most-significant-bit. The term LSB is least-significant-bit. Digital to Analog Converter is DAC and current mode DAC is iDAC. Analog to Digital to Converter is ADC and current mode ADC is iADC. SPICE is Simulation Program with Integrated Circuits Emphasis.

The CMOSFETs, that operate in the subthreshold region, follow an approximate exponential $v_I$ to $i_O$ transfer function that can approximately be represented as follows:

$$i_D \approx I_{DO} \times \frac{W}{L} \times e^{\frac{v_{GS}-V_{TH}}{n \times V_t}} \text{ or } v_{GS} - V_{TH} \approx n \times V_t \times \ln\left[\frac{i_D}{I_{DO} \times \frac{W}{L}}\right]$$

wherein for a MOSFET: the $V_{TH}$ is threshold voltage, $v_{GS}$ is voltage between gate-terminal to source-terminal, $i_D$ is current through the drain terminal, $$\frac{W}{L}$$

is a channel-width over channel-length ratio, $V_t$ is thermal voltage, n is slope factor, $I_{DO}$ is the characteristics current when $v_{GS} \approx V_{TH}$. Note that in the case of a MOSFET operating in subthreshold, $v_I$ corresponds to $v_{GS}$, and $i_O$ corresponds to $i_D$ or $i_{DS}$. Moreover, note that for two equally sized and same type subthreshold MOSFET $$v_{GS1} - v_{GS2} \approx n \times V_t \times \ln\left[\frac{i_{D1}}{i_{D2}}\right]$$

where $v_{GS1}$ and $v_{GS2}$ are the first and second MOSFET's $v_{GS}$s or $v_I$s, and $i_{D1}$, $i_{D2}$ are the first and second MOSFET's $i_D$s or $i_O$s. Note that throughout this disclosure, MOSFETs that operate in subthreshold have equal $$\frac{W}{L}s,$$

unless otherwise specified. Unless otherwise specified, n stands for nano or $10^{-9}$, µ stands for micro or $10^{-6}$, and m stands for milli or $10^{-3}$. The term plurality (p) of channels refers to p>2.

Note that other manufacturing technologies, such as Bipolar, BiCMOS, and others can utilize this disclosure in whole or part.

This disclosure presents several SPICE circuit simulations illustrating functionality, and feasibility of the disclosed embodiments. These simulations are not intended to guarantee the embodiment's performance to a particular range of specifications. Note that circuit simulations use the TOPSPICE simulator, and are based on approximate device models for a typical mainstream–0.18 µm CMOS process fabrication.

Throughout this disclosure, analog multipliers (iMULT) circuits operate in current-mode and generally have the following benefits:

First, the disclosed multi-quadrant multiplier utilizes only one single-quadrant multiplier, which keeps the circuit simple and save on die area and cost.

Second, analog iMULT circuits in this disclosure can operate at higher speeds because they operate in current-mode, which is inherently fast.

Third, given that the core of the disclosed multi-quadrant multiplier utilizes only one single-quadrant multiplier, the linearity of each of the four quadrant's transfer function match each other.

Fourth, signal processing, that occurs within the nodes of iMULT and iMAC circuits in current mode, have small voltage swings (while retaining their speed and dynamic range benefits) which also enables operating the current-mode with lower power supply voltages.

Fifth, because the core of the disclosed multi-quadrant multiplier utilizes only one single-quadrant multiplier, the dynamic response at each of the respective multiplier's four quadrant match each other.

Sixth, the disclosed analog iMULT circuits operating in current mode, facilitates simple, low cost, and fast summation and or subtraction functions. For example, summation of plurality of analog currents could be accomplished by coupling the current signals. Depending on accuracy and speed requirements, subtraction of analog current signals could be accomplished by utilizing a current mirror where the two analog current signals are applied to the opposite side of the current mirror, for example.

Seventh, majority of iMULT disclosed here, can operate with low power supplies since their operating headroom can be limited by a FET's $V_{GS}$, $V_{DS}$, and naturally operating at low power supply voltages reduces power consumption.

Eighth, operating the CMOSFETs, where applicable, in subthreshold enables analog iMULT circuits to operate with ultra-low currents, even lower power supplies, and ultra-low power consumption suitable for mobile applications, especially in mobile and portable and on-sensor AI & ML applications that may require numerous ultra-low current and low voltage supply analog iMULT circuits for computation.

Ninth, iMULT can be arranged to generate non-linear outputs such as in square input-output transfer function or inverse input-output transfer functions. For example, by applying the same input to the two inputs of a multiplier, a square of the input can be generated at the output of the multiplier.

Tenth, the disclosed analog iMULT circuits not requiring any capacitors nor any resistors, which reduces die size and die cost, and facilitates fabricating analog iMULT circuits in standard digital CMOS manufacturing that is not only low cost, but also main-stream and readily available for high-volume mass production applications, and proven for being rugged and having high quality.

Eleventh, the disclosed analog iMULT circuits are free of clock, suitable for asynchronous (clock free) computation. As such, there is no clock related noise on power supplies and there is no dynamic power consumption due to a digital logic.

Twelfth, the disclosed analog iMULT circuits are arranged in a symmetric, matched, and scaled manner. This trait facilitates devices parameters to track each other over process, temperature, and operating condition variations. Accordingly, the disclosed analog iMULT circuit's temperature coefficient and power supply rejection performance can be enhanced.

Thirteenth, while digital computation is generally accurate but its higher power consumption may not be suitable for some low power applications. Current-mode analog and mixed-signal computation that is disclosed here leverage the trade off in analog signal processing between low power and analog accuracy in form of signal degradation, but not total failures. This trait can provide the AI & ML end-application with approximate results to work with instead of experiencing failed results.

Fourteenth, utilizing plurality of analog inputs that are summed at an plurality of inputs or outputs of iMULTs (to arrange an analog scalar iMAC) would attenuate the statistical contribution of such cumulative analog random errors (such as random noise, offset, mismatches, linearity, gain, drift, etc.) at the summing nodes where plurality of analog iMULT currents are coupled (which are generated via the iDACs). The statistical contribution of such cumulative analog random errors, at the summing node, is the square root of the sum of the squares of such random error terms.

Fifteenth, voltage mode multiplier's full-scale input and output voltage signal swings are restricted by power supply voltage levels. However, so long as operational transistor headroom is complied with, the disclosed analog current-mode iMULT and siMAC input and output current signals can span between zero and full scale, generally independent of the power supply voltage level.

Sixteenth, the present disclosure provides iMULT and iMAC circuits that enable AI and ML applications to process information at or near edge and sensors which improves privacy, instead of sending information on the cloud.

Seventeenth, the present disclosure provides iMULT and iMAC circuits for AI and ML applications that can run asynchronously which reduces latency and provides real-time computation.

Eighteenth, the present disclosure provides iMULT and iMAC circuits AI and ML applications that can run asynchronously which frees the computation from read-write cycles to and from memory, which reduces dynamic power consumption and reduces memory area on chip.

Section 1A—Description of FIG. 1A

FIG. 1A is a simplified circuit schematic illustrating an analog current-mode signal conditioning ($iSC_{1a}$) circuit.

The disclosed $iSC_{1a}$ embodiment illustrated in FIG. 1A receives a bipolar signal at its input $Ii_{1a}$ and generates a unipolar signal at its output $Io_{1a}$ and a sign (polarity) signal $S_{1a}$. The disclosed embodiment illustrated in the $iSC_{1a}$ circuit of FIG. 1A performs the function of a full-wave rectifier or absolute-value circuit, in current mode. It would be obvious to one skilled in the art to utilize other full-wave rectifier or absolute-value circuits or variation of $iSC_{1a}$. When $iSC_{1a}$ current input signal's polarity is positive, $M1_{1a}$ turns-off (which starves $M5_{1a}$ and $M6_{1a}$ from operating current). Here, $M2_{1a}$ turns-on and steers the $Ii_{1a}$ current signal into $M3_{1a}$ which is then mirrored through $M4_{1a}$ and onto the $Io_{1a}$ as the current output of $iSC_{1a}$. Concurrently, $S_{1a}$ provides a sign signal reflecting the positive polarity of the bipolar signal at $iSC_{1a}$'s input $Ii_{1a}$. Conversely, when $iSC_{1a}$ current input signal's polarity is negative, $M2_{1a}$ turns-off. Here, $M1_{1a}$ turns-on and steers the $Ii_{1a}$, current signal into $M5_{1a}$ which is then mirrored through $M6_{1a}$ and flown onto $M3_{1a}$ which is mirrored again onto $M4_{1a}$ as $Io_{1a}$, the current output of $iSC_{1a}$. Concurrently, $S_{1a}$ provides a sign signal reflecting the negative polarity of the bipolar signal at $iSC_{1a}$'s input $Ii_{1a}$.

Note that the current mirrors $M3_{1a}$-$M4_{1a}$ and $M5_{1a}$-$M6_{1a}$ can be cascoded to improve the mirrors output impedance and matching. Moreover, to improve the dynamic response of the $iSC_{1a}$, a small DC injection current could be provided to the mirrors (and subtracted from output) to keep the mirrors alive during zero-scale transients. Additionally, note that the amplifier functions $A1_{1a}$ and $A2_{1a}$ can utilize low cost and simple single stage common-source amplifiers (comprising of a FET and a current source each)

The disclosed $iSC_{1a}$ operates in current mode and as such it possesses the relevant benefits listed earlier in the DETAILED DESCRIPTION introductions section the pertain to the disclosed circuits, which operate in current-mode.

Section 1B—Description of FIG. 1B

FIG. 1B is a simplified circuit schematic illustrating a digital signal conditioning ($dSC_{1b}$) circuit.

The disclosed $dSC_{1b}$ embodiment illustrated in FIG. 1B operates based on sign-magnitude method of representing positive and negative numbers on both side of zero. Accordingly, the Most-Significant-Bit (MSB) of the digital input data represents the sign of the digital input date and the remaining digital input data bits represent the magnitude (or absolute value) of the digital input data. Here, $dSC_{1b}$ receives the digital input data $Di_{1b}$ that is m-bits wide. As noted, the sign of $Di_{1b}$ is represented by its MSB here. As such, $dSC_{1b}$ passes on the MSB as the (sign-bit) to the output signal $S_{1b}$. The remaining sequence of m−1 bits of the digital input data are coupled to the respective sequence of the first input ports of m−1 Exclusive NORs (m−1 of $XNOR_{1b}$s).

The MSB of $Di_{1b}$ is coupled to the second input ports of the m−1 of $XNOR_{1b}s$. Accordingly, $dSC_{1b}$ generate a m−1 bits wide word, $Do_{1b}$, at the m−1 outputs of the $XNOR_{1b}s$, which represents the magnitude word bits. Note that it would be obvious to one skilled in the art to utilize other digital binary formatting methods, including but not limited to, 2's complement, 1's complement, and offset-binary.

Section 1C—Description of FIG. 1C

FIG. 1C is a simplified circuit schematic illustrating a digital polarity conditioning ($dPC_{1c}$) circuit.

The disclosed $dPC_{1c}$ embodiment illustrated in FIG. 1C also operates based on sign-magnitude method of representing positive and negative numbers on both side of zero. The $dPC_{1c}$ receives the digital input data $Di_{1c}$ that is m−1 bits wide that are fed onto the respective sequence of the first input ports of m−1 Exclusive NORs (m−1 of $XNOR_{1c}s$). The second input ports of the m−1 of $XNOR_{1c}s$ is coupled to the $S_{1c}$ that is a sign-bit digital input signal. Here, $S_{1c}$ digital input bit is assigned the Most-Significant-Bit (MSB) of the digital out data $Do_{1c}$. Accordingly, $dPC_{1c}$ generate a m−1 bits wide word, $Do_{1c}$, at the m−1 outputs of the $XOR_{1c}s$ which is combined with the $S_{1c}$ signal (as $Do_{1c}$'s MSB) to make up the digital output word at $Do_{1c}$. As stated earlier, it would be obvious to one skilled in the art to utilize other digital binary formatting methods, including but not limited to, 2's complement, 1's complement, and offset-binary, amongst others.

Figure 1D:
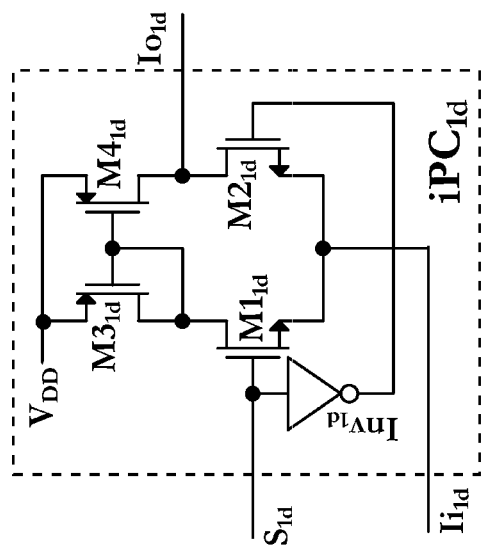
FIG. 1D is a simplified circuit schematic illustrating an analog current-mode polarity conditioning ($iPC_{1d}$) circuit.

Section 1D—Description of FIG. 1D

FIG. 1D is a simplified circuit schematic illustrating an analog current-mode polarity conditioning ($iPC_{1d}$) circuit.

The disclosed $iPC_{1d}$ embodiment illustrated in FIG. 1D receives a digital-input sign signal $S_{1d}$ and an analog input-current magnitude signal $Ii_{1d}$. When $S_{1d}$'s polarity is positive, then $M2_{1d}$ is turned-off and $M1_{1d}$ is turned-on which steers $Ii_{1d}$ onto $M3_{1d}$ that is mirrored through $M4_{1d}$ and sourced onto an analog current output at $Io_{1d}$. Conversely, when $S_{1d}$'s polarity is negative, then $M1_{1d}$ is turned-off and $M2_{1d}$ is turned-on which steers $Ii_{1d}$ through $M2_{1d}$ and onto an analog current output at $Io_{1d}$.

Note that the current mirrors $M3_{1d}$-$M4_{1d}$ can be cascoded to improve the mirrors output impedance and matching. Moreover, to improve the dynamic response of the $iPC_{1d}$, a small DC injection current could be provided to the mirrors (and subtracted from output) to keep the mirrors alive during zero-scale transients.

The disclosed $iPC_{1d}$ operates in current mode and as such it possesses the relevant benefits listed earlier in the DETAILED DESCRIPTION introductions section that pertain to the disclosed circuits operating in current-mode.

Figure 1E:
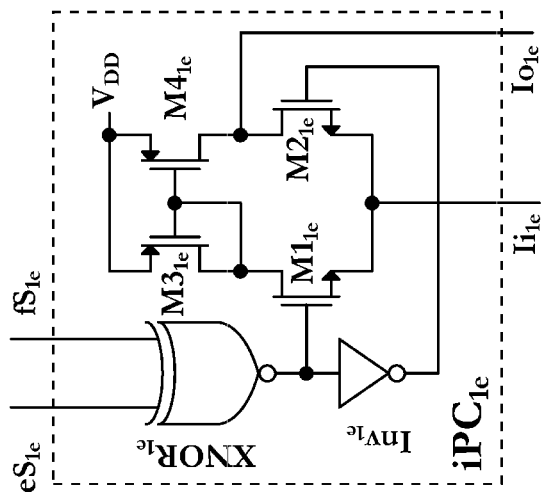
FIG. 1E is a simplified circuit schematic illustrating another analog current-mode polarity conditioning ($iPC_{1e}$) circuit.

Section 1E—Description of FIG. 1E

FIG. 1E is a simplified circuit schematic illustrating another analog current-mode polarity conditioning ($iPC_{1e}$) circuit.

The disclosed $iPC_{1e}$ embodiment illustrated in FIG. 1E receives two digital-input sign signals $eS_{1e}$ and $fS_{1e}$, and an analog input-current magnitude signal $Ii_{1e}$. The pair of $eS_{1e}$ and $fS_{1e}$ polarity signals are inputted to an exclusive NOR ($XNOR_{1e}$). When the output of $XNOR_{1e}$'s polarity is positive, then $M2_{1e}$ is turned-off and $M1_{1e}$ is turned-on which steers $Ii_{1e}$ onto $M3_{1e}$ that is mirrored through $M4_{1e}$ and sourced onto an analog current output at $Io_{1e}$. Conversely, when the output of $XNOR_{1e}$'s polarity is negative, then $M1_{1e}$ is turned-off and $M2_{1e}$ is turned-on which steers $Ii_{1e}$ through $M2_{1e}$ and onto the analog current output at $Io_{1e}$.

Note that the current mirrors $M3_{1e}$-$M4_{1e}$ can be cascoded to improve the mirrors output impedance and matching. Moreover, to improve the dynamic response of the $iPC_{1e}$, a small DC injection current could be provided to the mirrors (and subtracted from output) to keep the mirrors alive during zero-scale transients.

The disclosed $iPC_{1e}$ operates in current mode and as such it possesses the relevant benefits listed earlier in the DETAILED DESCRIPTION introductions section that pertain to the disclosed circuits operating in current-mode.

Figure 2A:
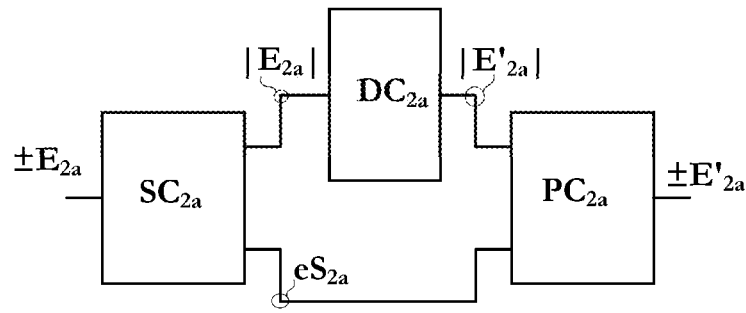
FIG. 2A is a simplified block diagram illustrating a mixed-mode bipolar data-converter (BiDC) method.

Section 2A—Description of FIG. 2A

FIG. 2A is a simplified block diagram illustrating a mixed-mode (multi-quadrant) bipolar data-converter (BiDC) method.

In the disclosed BiDC method of FIG. 2A, a bipolar-input signal $\pm E_{2a}$ is inputted to a signal conditioning block ($SC_{2a}$). The $SC_{2a}$ generate a unipolar-output signal ($|E_{2a}|$) and a sign signal ($eS_{2a}$). The $eS_{2a}$ represents the sign of the bipolar-input signal. Next, the unipolar signal $|E_{2a}|$ is inputted onto a unipolar-input to unipolar-output (single-quadrant) data-converter ($DC_{2a}$). The $DC_{2a}$ converts the data that is the unipolar signal $|E_{2a}|$ to another form of a data that is a unipolar signal ($|E'_{2a}|$) at its output. Lastly, a unipolar-input to bipolar-output polarity conditioning block ($PC_{2a}$) is inputted with the $|E'_{2a}|$ and the sign signal $eS_{2a}$. The $PC_{2a}$ generates a (multi-quadrant)$\pm E'_{2a}$ which is another form of the bipolar-input signal $\pm E_{2a}$. The disclosed method attains improved cost-performance advantages for utilizing unipolar data converter (combined with front-end signal conditioning and back-end polarity conditioning) to preform bipolar data conversion.

Figure 2B:
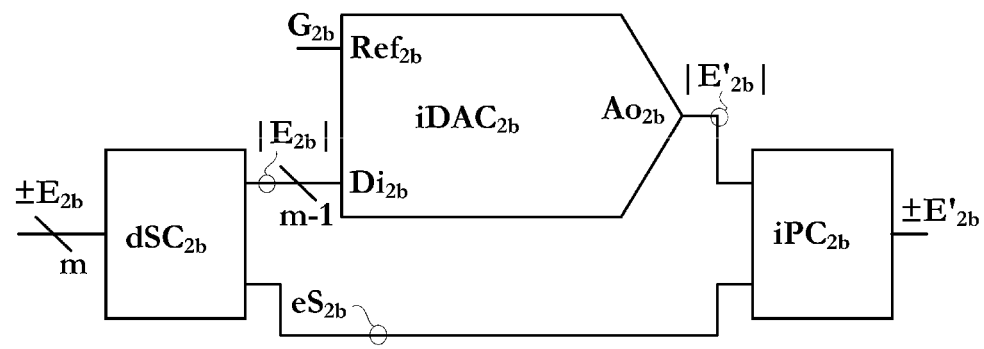
FIG. 2B is a simplified block diagram illustrating a bipolar current-mode digital-to-analog converter (BiDAC) that utilizes the BiDC method illustrated in FIG. 2A.

Section 2B—Description of FIG. 2B

FIG. 2B is a simplified block diagram illustrating a (multi-quadrant) bipolar current-mode digital-to-analog converter (BiDAC) that utilizes the BiDC method disclosed in Section 2A.

In the disclosed embodiment of FIG. 2B, a digital-input signal $\pm E_{2b}$ is inputted to a digital-input to digital-output signal conditioning block ($SC_{2b}$). The $SC_{2b}$ can utilize a circuit embodiment such as ($dSC_{1b}$) that is disclosed in section 1B and illustrated in FIG. 1B. As such, the $dSC_{2b}$ generate a digital-output magnitude signal ($|E_{2b}|$) that is m−1 bits wide. The $dSC_{2b}$ also generate a sign signal ($eS_{2b}$), which is the MSB of the digital-input signal $\pm E_{2b}$. The m−1 bits wide digital magnitude signal $|E_{2b}|$ is inputted to a (single-quadrant) unipolar $iDAC_{2b}$'s digital input port $Di_{2b}$ that is also m−1 bits wide. Concurrently, the unipolar $iDAC_{2b}$ receives a reference current signal ($G_{2b}$) at its reference input port $Ref_{2b}$. Next, the unipolar $iDAC_{2b}$ generates a unipolar (magnitude) analog current output signal ($|E'_{2b}|$) at its current output port $Ao_{2b}$. Note that $|E'_{2b}|$ represents the analog form of the magnitude portion of the digital-input signal $\pm E_{2b}$. Then, the unipolar magnitude analog current signal $|E'_{2b}|$ is inputted onto an analog current mode polarity conditioning block ($iPC_{2b}$). The $iPC_{2b}$ can utilize a circuit embodiment such as ($iPC_{1d}$) that is disclosed in section 1D and illustrated in FIG. 1D. The $iPC_{2b}$ also receives the sign signal $eS_{2b}$. Thus, the $iPC_{2b}$ generates a (multi-quadrant) bipolar analog current output signal $\pm E'_{2b}$, which represents a (multi-quadrant) bipolar analog from of the digital-input signal $\pm E_{2b}$.

As stated earlier, it would be obvious to one skilled in the art to utilize other digital binary formatting methods, including but not limited to, 2's complement, 1's complement, and offset-binary.

The disclosed BiDAC of FIG. 2B operates in current mode and as such it possesses the relevant benefits listed earlier in the DETAILED DESCRIPTION introductions section the pertain to the disclosed circuits that operate in current-mode. Also, a unipolar iDAC is generally smaller, faster, lower power, and less complex than for example a bipolar iDAC. Accordingly, to perform digital-input to bipolar-analog-output data-conversion, a combined digital signal conditioning (dSC) plus a unipolar iDAC plus analog polarity conditioning (iPC) circuits can provide improved cost-performance traits as compared to a bipolar iDAC.

Figure 2C:
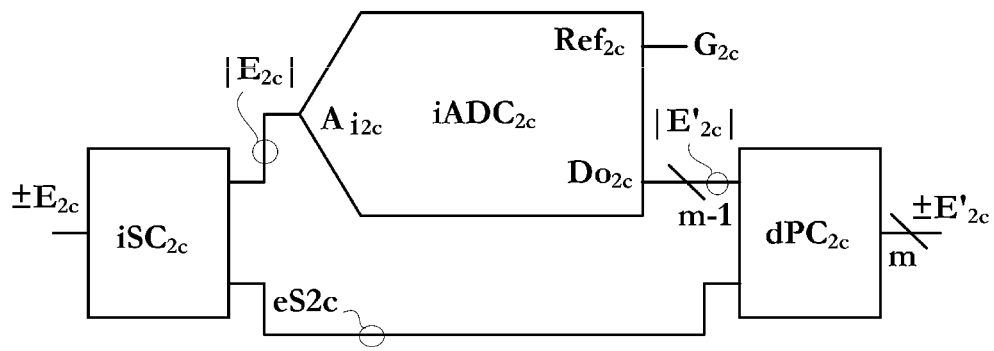
FIG. 2C is a simplified block diagram illustrating a bipolar current-mode analog-to-digital converter (BiADC) that utilizes the BiDC method illustrated in FIG. 2A.

Section 2C—Description of FIG. 2C

FIG. 2C is a simplified block diagram illustrating a (multi-quadrant) bipolar current-mode analog-to-digital converter (BiADC) that utilizes the BiDC method disclosed in Section 2A.

In the disclosed embodiment of FIG. 2C, a bipolar analog current input signal $\pm E_{2c}$ is inputted to an analog-input to analog-output signal conditioning block (iSC$_{2c}$). The iSC$_{2c}$ can utilize a circuit embodiment such as iSC$_{1a}$ that is disclosed in section 1A and illustrated in FIG. 1A. As such, the iSC$_{2c}$ generate a unipolar analog-output current magnitude signal ($|E_{2c}|$). The iSC$_2$, also generate a sign signal (eS$_{2c}$), which indicates the polarity of the digital-input signal $\pm E_{2c}$. Then unipolar analog current magnitude signal $|E_{2c}|$ is inputted to a (single-quadrant) unipolar iADC$_{2c}$'s analog current input port Ai$_{2c}$. Concurrently, the unipolar iADC$_{2c}$ receives a reference current signal (G$_{2c}$) at its reference input port Ref$_{2c}$. Next, the unipolar iADC$_{2c}$ generates a unipolar (magnitude) digital output signal ($|E'_{2c}|$) at its digital output port Do$_{2c}$. Note that $|E'_{2c}|$ represents the digital form of the magnitude portion of the bipolar analog-input signal $\pm E_{2c}$. Then, the unipolar magnitude analog current signal $|E'_{2c}|$ is inputted onto a digital polarity conditioning block (dPC$_{2c}$). The dPC$_{2c}$ can utilize a circuit embodiment such as (dPC$_{1d}$) that is disclosed in section 1C and illustrated in FIG. 1C. The dPC$_{2c}$ also receives the sign signal eS$_{2c}$ that is the MSB of the digital-output word. Thus, the dPC$_{2c}$ generates a digital output word (signal) $\pm E'_{2c}$, which represents a digital from of the bipolar analog input signal $\pm E_{2c}$.

As stated earlier, it would be obvious to one skilled in the art to utilize other digital binary formatting methods, including but not limited to, 2'a complement, 1's complement, and offset-binary.

The disclosed BiADC of FIG. 2C operates in current mode and as such it possesses the relevant benefits listed earlier in the DETAILED DESCRIPTION section. Also, a unipolar iADC is generally smaller, faster, lower power, and less complex than a bipolar iADC. Accordingly, to perform digital-input to bipolar-analog-output data-conversion, a combined digital signal conditioning (dSC) plus a unipolar iADC plus an analog polarity conditioning (iPC) circuits can provide improved cost-performance traits as compared to a bipolar iADC.

Figure 3A:
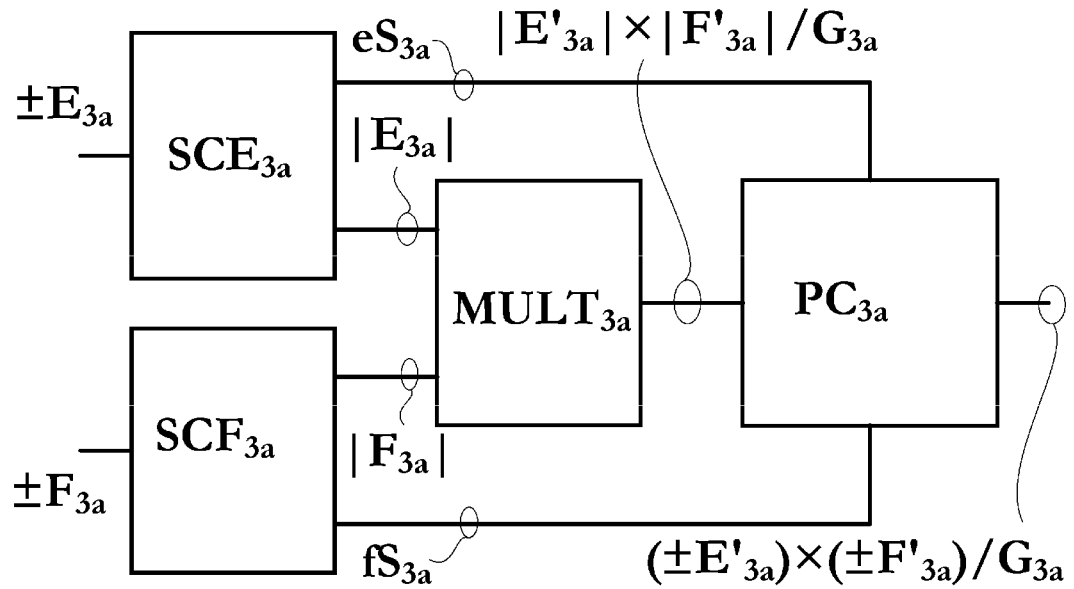
FIG. 3A is a simplified block diagram illustrating a multi-quadrant multiplier (qMULT) method.

Section 3A—Description of FIG. 3A

FIG. 3A is a simplified block diagram illustrating a multi-quadrant multiplier (qMULT) method.

In the disclosed qMULT method of FIG. 3A, an E bipolar input signal ($\pm E_{3a}$) is inputted to an E signal conditioning block (SCE$_{3a}$). The SCE$_{3a}$, generate an E unipolar signal ($|E_{3a}|$). The SCE$_{3a}$, also generates an E sign signal (eS$_{3a}$), which indicates the polarity of the E bipolar input signal $\pm E_{3a}$. Similarly, a F bipolar input signal ($\pm F_{3a}$) is inputted to a F signal conditioning block (SCF$_{3a}$). The SCF$_{3a}$, generate a F unipolar signal ($|F_{3a}|$). The SCF$_{3a}$, also generates a F sign signal (fS$_{3a}$), which indicates the polarity of the F bipolar input signal $\pm F_{3a}$. Then, a single-quadrant multiplier block (MULT$_{3a}$) receives the unipolar signals $|E_{3a}|$ and $|F_{3a}|$. The MULT$_{3a}$ generates a single-quadrant (unipolar) product signal $|E'_{3a}| \times |F'_{3a}|, /G_{3a}$, wherein G$_{3a}$ is a reference signal. Next, the single-quadrant product signal $|E'_{3a}| \times |F'_{3a}|/G_{3a}$ is inputted to a polarity conditioning block (PC$_{3a}$). The PC$_{3a}$, also receives the E and F sign signals, eS$_{3a}$ and fS$_{3a}$ and generates a multi-quadrant product signal $\pm E'_{3a} \times \pm F'_{3a}/G_{3a}$. Compared to a more complicated, bigger, and slower multi-quadrant multiplier that perform multi-quadrant multiplication, the disclosed method utilizes a simpler, smaller, and faster single-quadrant multiplier (combined with front-end signal conditioning and back-end polarity conditioning functions) to preform multi-quadrant multiplication.

Figure 3B:
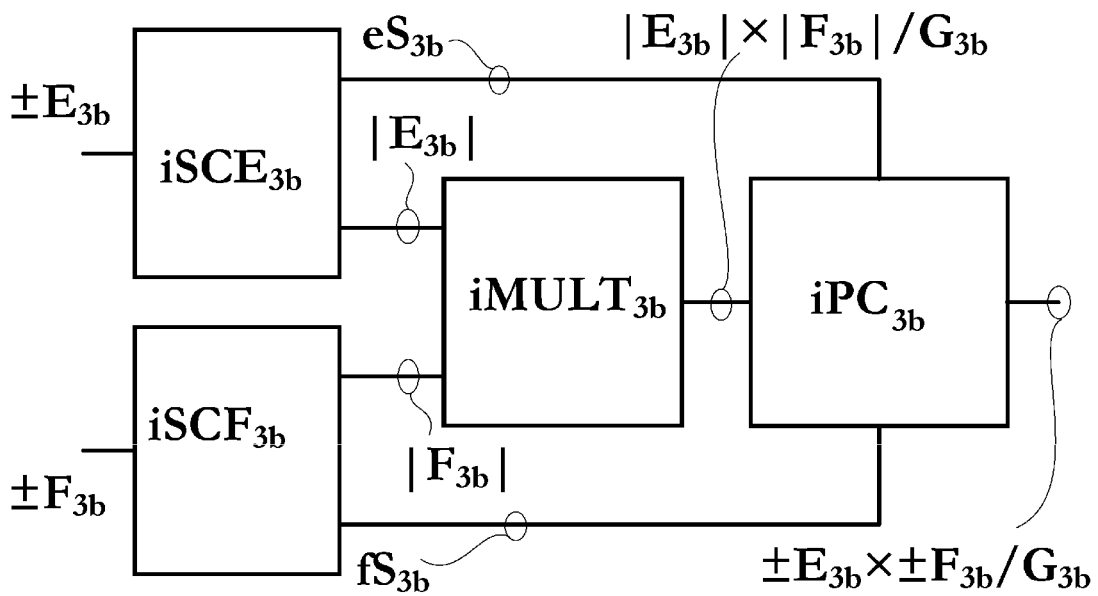
FIG. 3B is a simplified block diagram illustrating a multi-quadrant analog current-input to analog current-output multiplier ($qiMULT_{3b}$) utilizing the qMULT method illustrated in FIG. 3A.

Section 3B—Description of FIG. 3B

FIG. 3B is a simplified block diagram illustrating a multi-quadrant analog current-input to analog current-output multiplier (qiMULT$_{3b}$) utilizing the qMULT method disclosed in section 3A.

In the disclosed qiMULT$_{3b}$ of FIG. 3B, an E bipolar current input signal ($\pm E_{3b}$) is inputted to an E current signal conditioner (iSCE$_{3b}$). The iSCE$_{3b}$ can utilize a circuit embodiment such as iSC$_{1a}$ that is disclosed in section 1A and illustrated in FIG. 1A. The SCE$_{3b}$ generate an E unipolar output current signal ($|E_{3b}|$). The SCE$_{3b}$ also generates an E sign signal (eS$_{3b}$), which indicates the polarity of the E bipolar current input signal $\pm E_{3b}$. Similarly, a F bipolar current input signal ($\pm F_{3b}$) is inputted to a F current signal conditioner (iSCF$_{3b}$). Additionally, the iSCF$_{3b}$ can utilize a circuit embodiment such as iSC$_{1a}$ that is disclosed in section 1A and illustrated in FIG. 1A. The iSCF$_{3b}$ generate a F unipolar current signal ($|F_{3b}|$). The iSCF$_{3b}$ also generates a F sign signal (fS$_{3b}$), which indicates the polarity of the F bipolar current input signal $\pm F_{3b}$. Utilizing identical circuits for iSCF$_{3b}$ and iSCF$_{3b}$ would improve matching between E and F current signal conditioning paths. Then, a single-quadrant current multiplier (iMULT$_{3b}$) receives the unipolar current signals $|E_{3b}|$ and $|F_{3b}|$. The iMULT$_{3b}$ generates a single-quadrant (unipolar) product current signal $|E_{3b}| \times |F_{3b}|/G_{3b}$, wherein G$_{3b}$ is a reference current signal. Next, the single-quadrant product current signal $|E_{3b}| \times |F_{3b}|/G_{3b}$ is inputted to a current-mode polarity conditioner (iPC$_{3b}$). The iPC$_{3b}$ can utilize a circuit embodiment such as iPC$_{1e}$ that is disclosed in section 1E and illustrated in FIG. 1E. The iPC$_{3b}$ also receives the E and F sign signals, eS$_{3b}$ and fS$_{3b}$ and generates a multi-quadrant product current signal $\pm E_{3b} \times \pm F_{3b}/G_{3b}$.

Figure 3C:
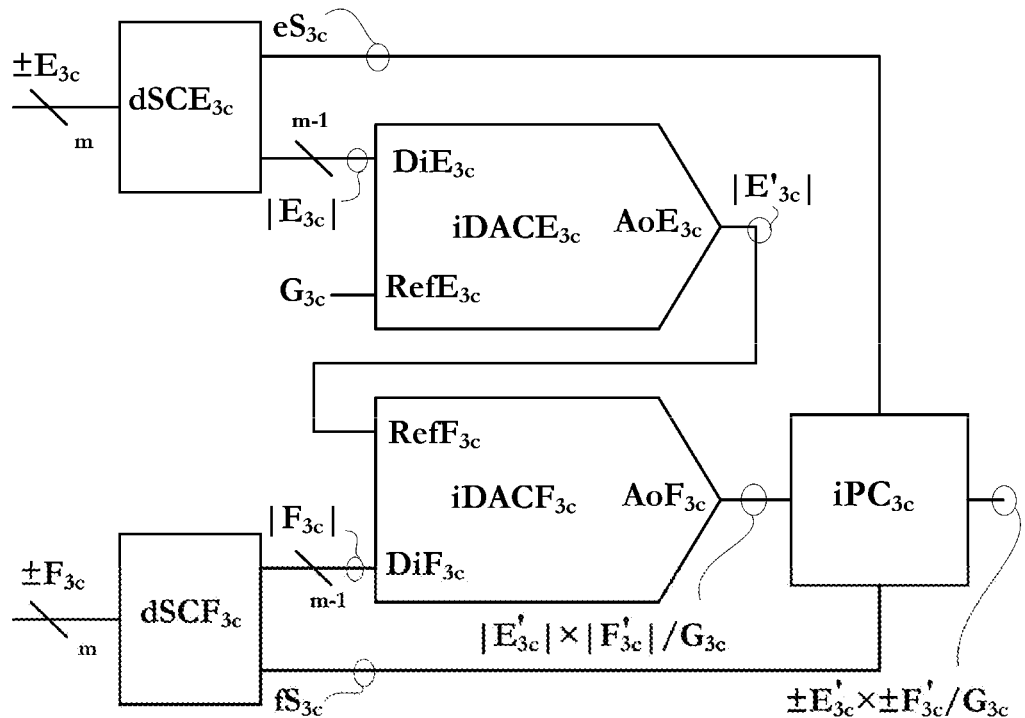
FIG. 3C is a simplified block diagram illustrating a multi-quadrant digital input to analog current output multiplier ($qiMULT_{3c}$) utilizing the qMULT method illustrated in FIG. 3A.
Figure 3D:
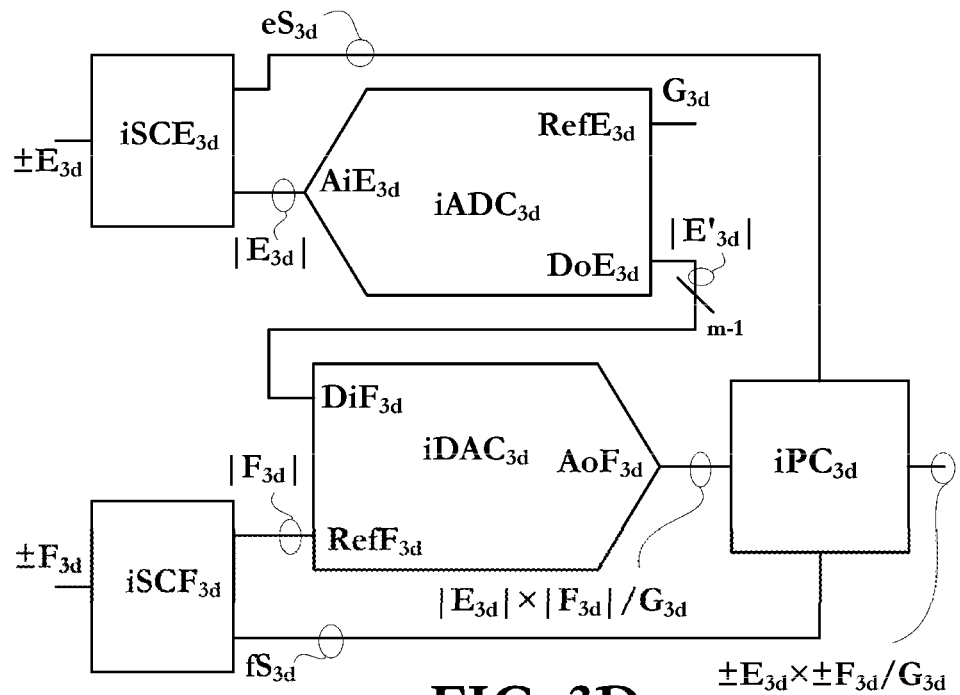
FIG. 3D is a simplified block diagram illustrating another multi-quadrant analog current-input to analog current-output multiplier ($qiMULT_{3d}$) utilizing the qMULT method illustrated in FIG. 3A.
Figure 3E:
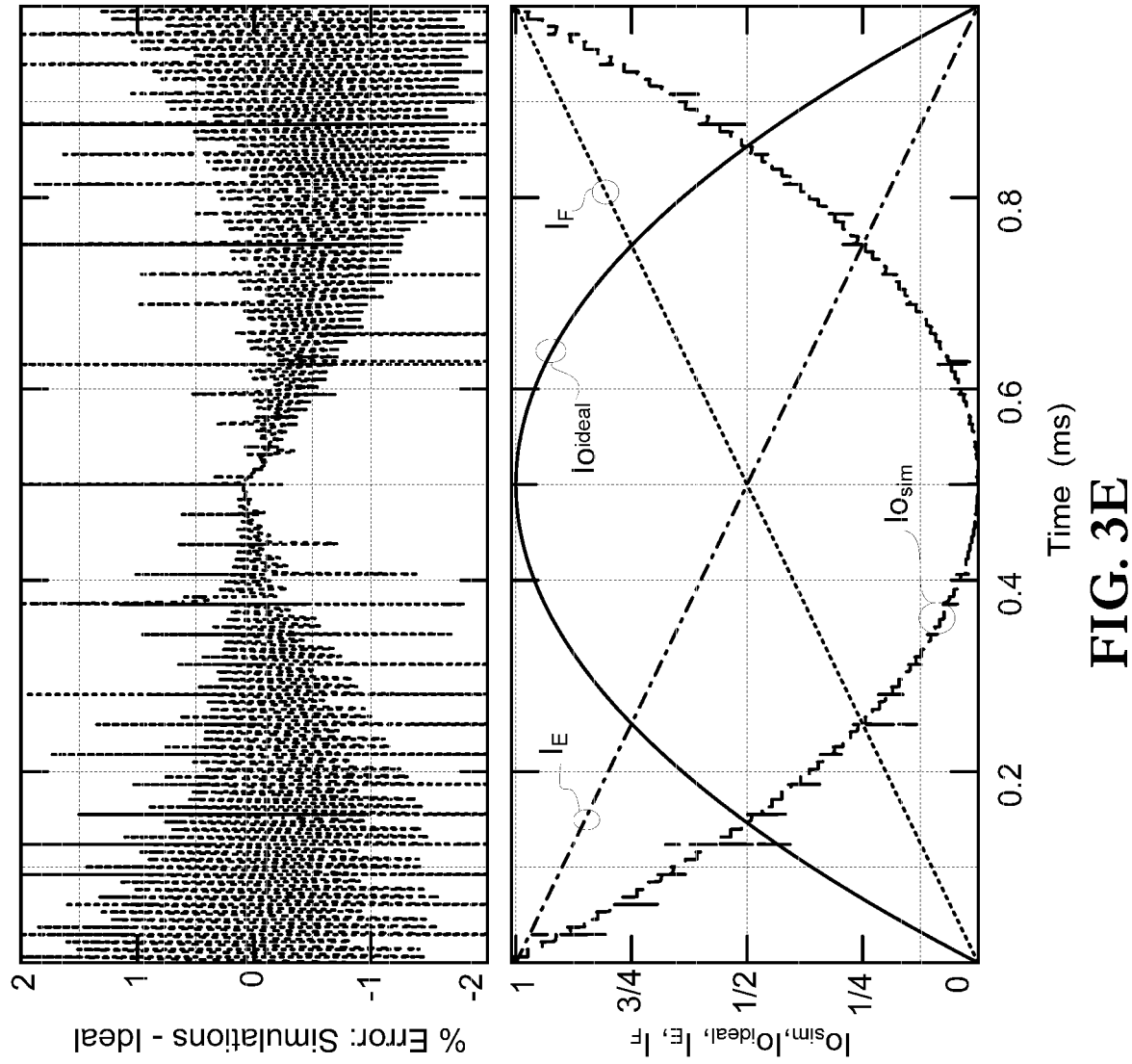
FIG. 3E illustrates a SPICE circuit simulation showing the input-output and linearity waveforms of the $qiMULT_{3c}$ of FIG. 3C.
Figure 3F:
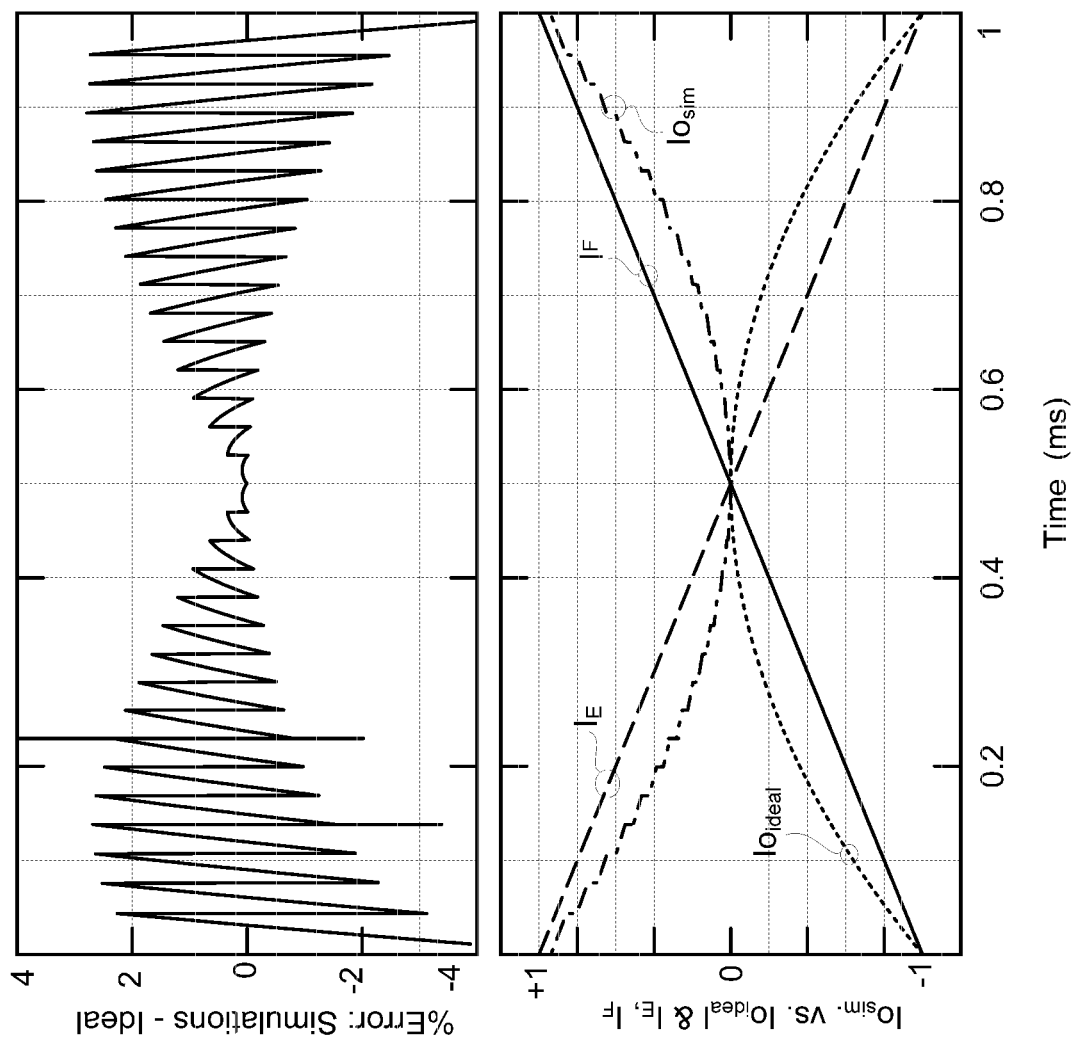
FIG. 3F illustrates a SPICE circuit simulation showing the input-output and linearity waveforms of the $qiMULT_{3d}$ of FIG. 3D.
Figure 3G:
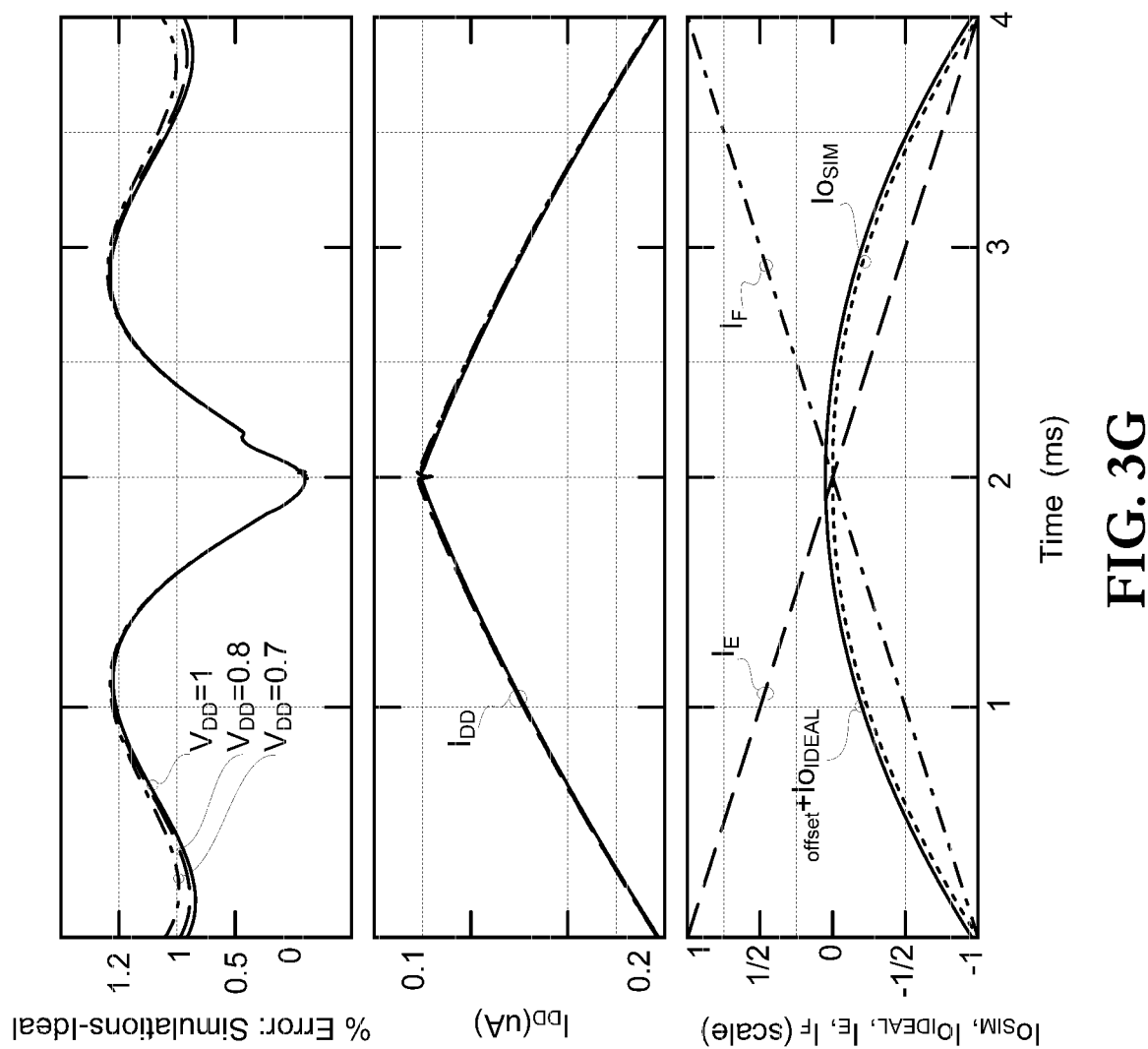
FIG. 3G illustrates a SPICE circuit simulation showing the input-output and linearity waveforms of the $qiMULT_{3b}$ of FIG. 3B.

Refer to section 3G and FIG. 3G which is a circuit simulation describing and illustrating the input-output waveforms of the qiMULT$_{3b}$ of FIG. 3B.

Figure 4A:
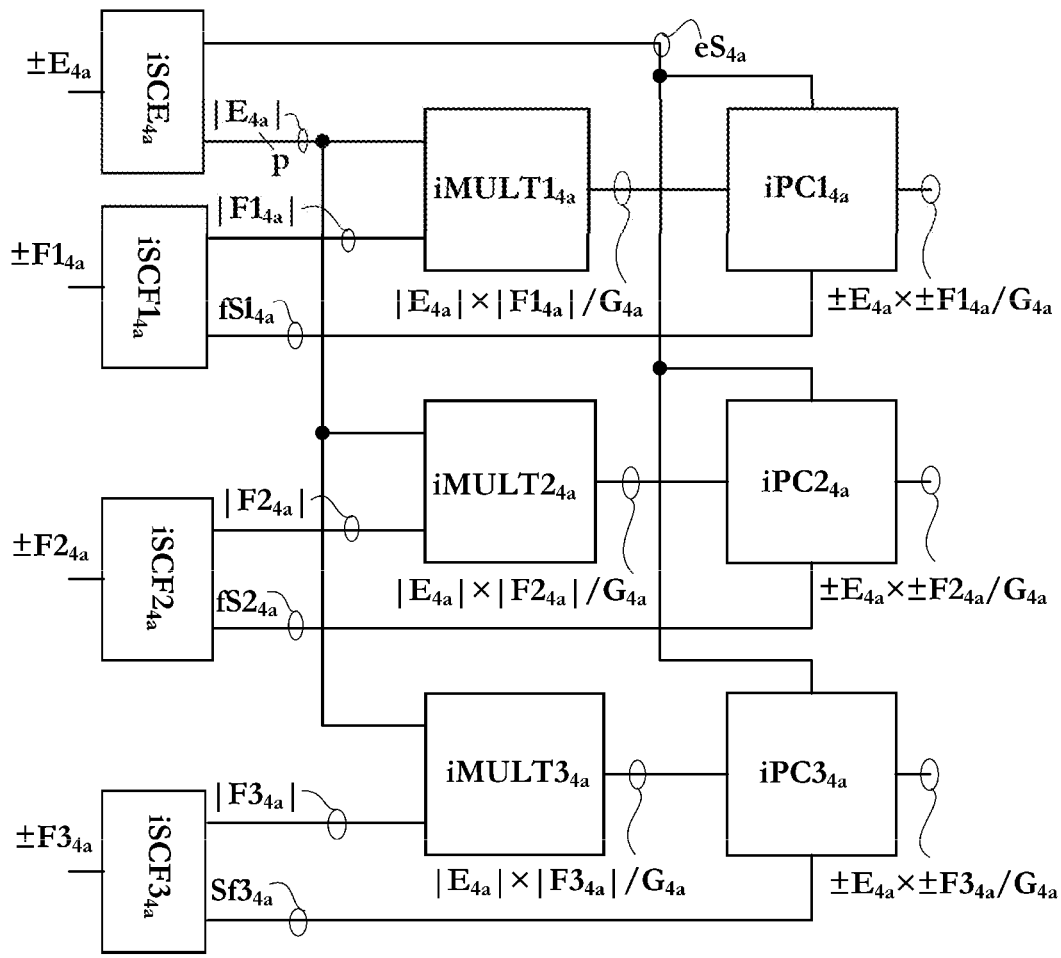
FIG. 4A illustrates a multiple-channel multi-quadrant analog current-input to current-output scalar multiplier ($SqiMULT_{4a}$)

Additionally, refer to section 4A and FIG. 4A which discloses a multiple-channel multi-quadrant analog current-input to current-output scalar multiplier (SqiMULT$_{4A}$) that utilizes plurality of qiMULT$_{3b}$.

The disclosed qiMULT$_{3b}$ of FIG. 3B operates in current mode and as such it possesses the relevant benefits listed earlier in the DETAILED DESCRIPTION section. Moreover, as compared to a more complicated, bigger, and slower multi-quadrant current mode multiplier, the disclosed method utilizes a simpler, smaller, and faster single-quadrant multiplier (combined with front-end signal conditioning and back-end polarity conditioning circuits) to preform multi-quadrant multiplication.

Section 3C—Description of FIG. 3C

FIG. 3C is a simplified block diagram illustrating a multi-quadrant digital input to analog current output multiplier (qiMULT$_{3c}$) utilizing the qMULT method disclosed in section 3A.

In the disclosed qiMULT$_{3c}$ of FIG. 3C, an E digital input signal ($\pm E_{3c}$), which is m bits wide, is inputted to an E digital signal conditioner (dSCE$_{3c}$), which operates in sign-magnitude method. As stated earlier, besides the sign-magnitude method, it would be obvious to one skilled in the art to utilize other digital binary formatting methods, including but not limited to, 2's complement, 1's complement, and offset-binary, amongst others. The dSCE$_3$, can utilize a circuit embodiment such as dSC$_{1b}$ that is disclosed in section 1B and illustrated in FIG. 1B. The dSCE$_{3c}$ generate a magnitude E digital signal ($|E_{3c}|$), which is m−1 bits wide. The dSCE$_{3c}$ also generates an E digital sign signal (eS$_{3c}$), which indicates the polarity of the E digital input signal $\pm E_{3c}$, which is the MSB of the $\pm E_{3c}$ digital signal.

Similarly, a F digital input signal that is m-bits wide ($\pm F_{3c}$) is inputted to a F digital signal conditioner (dSCF$_{3c}$). Moreover, the dSCF$_{3c}$ can utilize a circuit embodiment such as dSC$_{1b}$ that is disclosed in section 1B and illustrated in FIG. 1B. The dSCF$_{3c}$ generate a magnitude F digital signal ($|F_{3c}|$), which is m−1 bits wide. The dSCF$_{3c}$ also generates a F sign signal (fS$_{3c}$), which indicates the polarity of the F digital input signal $\pm F_{3c}$, which is the MSB of the $\pm F_{3c}$ digital signal.

Then, the $|E_{3c}|$ and $|F_{3c}|$ magnitude digital signals are inputted to a pair single-quadrant iDACs configured in multiplying DAC mode, as follows: An E single-quadrant iDACE$_{3c}$ receives a reference current signal G$_{3c}$ at its' current reference port RefE$_{3c}$. The iDACE$_{3c}$ receives the E magnitude digital signals $|E_{3c}|$ at its digital input port DiE$_{3c}$, and generates an E analog unipolar current signal $|E'_{3c}|$ at its current output port (AoE$_{3c}$). Concurrently, a F single-quadrant iDACF$_{3c}$ receives (as its reference current signal) the $|E'_3|$ from iDACE$_{3c}$ at its' current reference port RefF$_{3c}$. Concurrently, the iDACF$_{3c}$ receives the F magnitude digital signals $|F_{3c}|$ at its digital input port DiF$_{3c}$, and generates a F analog unipolar current signal at its current output port (AoF$_{3c}$). This single-quadrant (unipolar) analog current signal at the AoF$_{3c}$ output port is a single-quadrant (unipolar) product current signal representing $|E'_{3c}| \times |F'_{3c}|/G_{3c}$, wherein G$_{3c}$ is a reference current signal.

Next, the single-quadrant product current signal $|E'_{3c}| \times |F'_{3c}|/G_{3c}$ is inputted to a current-mode polarity conditioner (iPC$_{3c}$). The iPC$_{3c}$ can utilize a circuit embodiment such as iPC$_{1e}$ that is disclosed in section 1E and illustrated in FIG. 1E. The iPC$_{3c}$ also receives the E and F sign signals, eS$_{3c}$ and fS$_{3c}$ and generates a multi-quadrant product current signal $\pm E'_{3c} \times \pm F'_{3c}/G_{3c}$.

Refer to section 3E and FIG. 3E which is a circuit simulation describing and illustrating the input-output waveforms of the qiMULT$_{3c}$ of FIG. 3C.

Figure 4B:
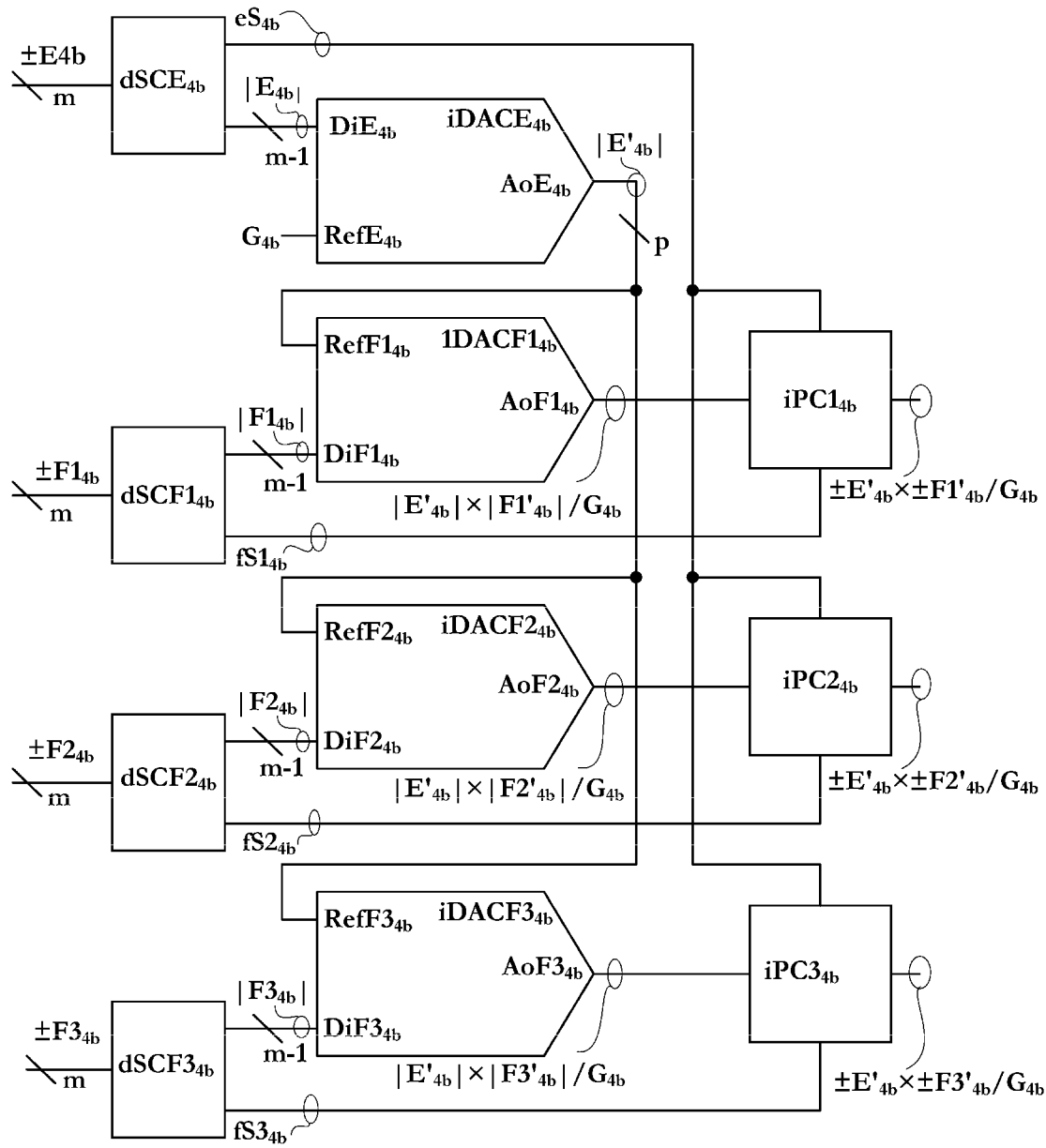
FIG. 4B illustrates a multiple-channel multi-quadrant digital-input to current-output scalar multiplier ($SqiMULT_{4b}$).

Moreover, refer to section 4B and FIG. 4B which discloses a multiple-channel multi-quadrant mixed-mode digital-input to current-output scalar multiplier (SqiMULT$_{4b}$) that utilizes plurality of qiMULT$_{3c}$.

The disclosed qiMULT$_{3c}$ of FIG. 3C operates in current mode and as such it possesses the relevant benefits listed earlier in the DETAILED DESCRIPTION section. Also, as compared to a more complicated, bigger, and slower multi-quadrant current mode multiplier, the disclosed method utilizes a simpler, smaller, and faster single-quadrant multiplier (combined with front-end signal conditioning and back-end polarity conditioning circuits) to preform multi-quadrant multiplication.

Section 3D—Description of FIG. 3D

FIG. 3D is a simplified block diagram illustrating another multi-quadrant analog current-input to analog current-output multiplier (qiMULT$_{3d}$) utilizing the qMULT method disclosed in section 3A.

In the disclosed qiMULT$_{3d}$ of FIG. 3D, an E analog current-input signal ($\pm E_{3d}$), that is inputted to an E analog current signal conditioner (iSCE$_{3d}$). The iSCE$_{3d}$ can utilize a circuit embodiment such as iSC$_{1a}$ that is disclosed in section 1A and illustrated in FIG. 1A. The iSCE$_{3d}$ generate a unipolar current signal ($|E_{3d}|$). The iSCE$_{3d}$ also generates an E digital sign signal (eS$_{3d}$), which indicates the polarity of the $\pm E_{3d}$.

Similarly, an F analog current-input signal ($\pm F_{3d}$) is inputted to an F analog current signal conditioner (iSCF$_{3d}$). Furthermore, the iSCF$_{3d}$ can utilize a circuit embodiment such as iSC$_{1a}$ that is disclosed in section 1A and illustrated in FIG. 1A. The iSCF$_{3d}$ generate a unipolar current signal ($|F_{3d}|$). The iSCF$_{3d}$ also generates a F sign signal (fS$_{3d}$), which indicates the polarity of the $\pm F_{3d}$.

Then, the $|E_{3d}|$ and $|F_{3d}|$ unipolar analog current signals are inputted to single-quadrant iADC and iDAC to perform a single quadrant multiplication as follows: A single-quadrant iADC$_{3d}$ receives a reference current signal G$_{ad}$ at its' current reference port RefE$_{3d}$. The iADC$_{3d}$ receives the unipolar analog current signals $|E_{3d}|$ at its analog input port AiE$_{3d}$, and generates a m−1 bits wide digital signal $|E'_{3d}|$ at its digital output port (DoE$_{3d}$). Concurrently, a F single-quadrant iDAC$_{3d}$ receives a reference current signal $|F_{3d}|$ from iSCF$_{3d}$ at its' current reference port RefF$_{3d}$. The iDAC$_{3d}$ receives the F magnitude digital signal $|E'_{3d}|$ at its digital input port DiF$_{3d}$, and generates an analog unipolar current signal at its current output port (AoF$_{3d}$). This single-quadrant (unipolar) analog current signal at the AoF$_{3d}$ is a single-quadrant (unipolar) product current signal $|E_{3d}| \times |F_{3d}|/G_{3d}$, wherein G$_{ad}$ is a reference current signal.

Next, the single-quadrant product current signal $|E_{3d}| \times |F_{3d}|/G_{3d}$ is inputted to a current-mode polarity conditioner (iPC$_{3d}$). The iPC$_{3d}$ can utilize a circuit embodiment such as iPC$_{1e}$ that is disclosed in section 1E and illustrated in FIG. 1E. The iPC$_{3d}$ also receives the E and F sign signals, eS$_{3d}$ and fS$_{3d}$ and generates a multi-quadrant product current signal $\pm E_{3d} \times \pm F_{3d}/G_{3d}$.

Refer to section 3F and FIG. 3F which is a circuit simulation describing and illustrating the input-output waveforms of the qiMULT$_{3d}$ of FIG. 3D.

Figure 4C:
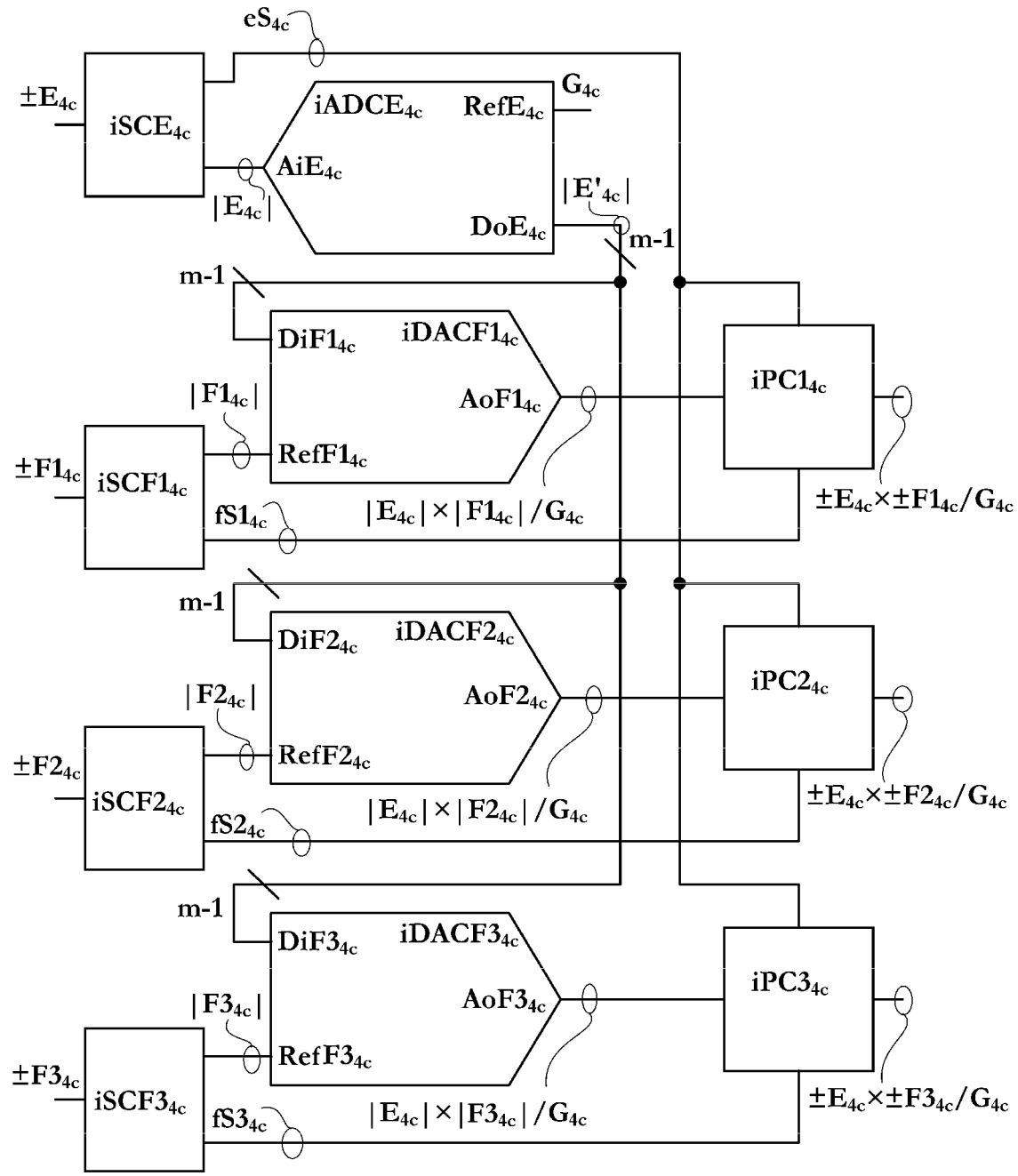
FIG. 4C illustrates another multiple-channel multi-quadrant analog current-input to current-output scalar multiplier ($SqiMULT_{4c}$).

Furthermore, refer to section 4C and FIG. 4C which discloses a multiple-channel multi-quadrant mixed-mode current-input to current-output scalar multiplier (SqiMULT$_{4c}$) that utilizes plurality of qiMULT$_{3d}$.

The disclosed qiMULT$_{3d}$ of FIG. 3D operates in current mode and as such it possesses the relevant benefits listed earlier in the DETAILED DESCRIPTION section. Additionally, as compared to a more complicated, bigger, and slower multi-quadrant current mode multiplier, the disclosed method utilizes a simpler, smaller, and faster single-quadrant multiplier (combined with front-end signal conditioning and back-end polarity conditioning) to preform multi-quadrant multiplication.

Section 3E—Description of FIG. 3E

FIG. 3E, including an upper-graph and a lower-graph, is a SPICE circuit simulation showing the input-output and linearity waveforms of the multi-quadrant digital input to analog current output multiplier (qiMULT$_{3c}$) of FIG. 3C in section 3C.

For illustrative clarity, the digital input signals $\pm E_{3c}$ and $\pm F_{3c}$ of qiMULT$_{3c}$ of FIG. 3C are fed into an ideal iDAC to provide their analog current signal equivalents $I_E$ and $I_F$, respectively, that are plotted and marked in the lower-graph of FIG. 3E. The $\pm E_{3c}$ and $\pm F_{3c}$ digital input signals (and their representative analog current signals $I_E$ and $I_F$) are ramped up and down, respectively, between negative-full-scale (indicated as 0 on the vertical axis of lower-graph of FIG. 3E) and positive-full-scale (indicated as +1 on the vertical axis of lower-graph of FIG. 3E). The zero-scale is depicted as ½ point on the vertical axis of the lower-graph of FIG. 3E. Additionally, an ideal multiplication result $Io_{ideal}=I_E \times I_F/I_R$ is plotted and marked in the lower-graph of FIG. 3E, wherein $I_R$ is the reference current signal $G_{3c}$.

In FIG. 3C in section 3C, the output of qiMULT$_{3c}$ (which is the output of iPC$_{3c}$) is Io$_{sim}$. For illustrative clarity of FIG. 3E and to avoid overlapping Io$_{ideal}$ over Io$_{sim}$, the Io$_{sim}$ is inverted, and plotted in the lower-graph of FIG. 3E. The Io$_{sim}$ in FIG. 3E represents the multi-quadrant product output current signal $\pm E'_{3c} \times \pm F'_{3c}/G_{3c}$ of FIG. 3C.

The upper-graph of FIG. 3E is a plot of the linearity error in % of full scale that is the difference between the Io$_{ideal}$ and Io$_{sim}$ (the output current signal of the qiMULT$_{3c}$ simulated results). Note that the single-quadrant iDACE$_{3c}$ and iDACF$_{3c}$ of FIG. 3C each have 6-bits of resolution (m=6), whose LSB amounts to $½^6=1.6\%$ of full-scale. Furthermore, note that for illustrative clarity the iDACE$_{3c}$ and iDACF$_{3c}$ gain errors and offset are adjusted for (with respect to full-scale). As shown in the upper-graph of FIG. 3E is a plot of the linearity error in % of the multi-quadrant digital input to analog current output multiplier (qiMULT$_{3c}$) that peaks to about ±1.6% at the two full-scale ends (note that $-1 \rightarrow +1$ full-scale for FIG. 3E is illustrated based on $0 \rightarrow 1$ full-scale).

Section 3F—Description of FIG. 3F

FIG. 3F, including an upper-graph and a lower-graph, is a SPICE circuit simulation showing the input-output and linearity waveforms of the multi-quadrant digital input to analog current output multiplier (qiMULT$_{3d}$) of FIG. 3D in section 3D.

The input current signals $\pm E_{3d}$ and $\pm F_{3d}$ of qiMULT$_{3d}$ of FIG. 3D are marked as $I_E$ and $I_F$, respectively, in the lower-graph of FIG. 3F. The $\pm E_{3d}$ and $\pm F_{3d}$ digital input signals (i.e., $I_E$ and $I_F$) are ramped up and down, respectively, between negative-full-scale (indicated as −1 on the vertical axis of lower-graph of FIG. 3F) and positive-full-scale (indicated as +1 on the vertical axis of lower-graph of FIG. 3F). The zero-scale is depicted as 0 point on the vertical axis of the lower-graph of FIG. 3F. Moreover, an ideal multiplication result $Io_{ideal}=I_E \times I_F/I_R$ is plotted and marked in the lower-graph of FIG. 3F, wherein $I_R$ is the reference current signal $G_{ad}$.

In FIG. 3D in section 3D, the output of qiMULT$_{3d}$ (which is the output of iPC$_{3d}$) is Io$_{sim}$. For illustrative clarity of FIG. 3F and to avoid overlapping Io$_{ideal}$ over Io$_{sim}$, the Io$_{sim}$ is inverted, and plotted in the lower-graph of FIG. 3D. The Io$_{sim}$ in FIG. 3F represents the multi-quadrant product output current signal $\pm E_{3d} \times \pm F_{3d}/G_{3d}$ of FIG. 3D.

The upper-graph of FIG. 3F is a plot of the linearity error in % of full scale that is the difference between the Io$_{ideal}$ and Io$_{sim}$ which is the output current signal of the qiMULT$_{3d}$ simulated results. Note that the single-quadrant iADCE$_{3d}$ and iDACF$_{3d}$ of FIG. 3D each have 4-bits of resolution (m=4), whose LSB amounts to $½^4=6.25\%$ of full-scale. Additionally, note that for illustrative clarity the iADCE$_{3d}$ and iDACF$_{3d}$ gain errors and offset are adjusted for (with respect to full-scale). As shown in the upper-graph of FIG. 3F is a plot of the linearity error in % of the multi-quadrant analog input to analog current output multiplier (qiMULT$_{3d}$) that peaks to about 6% at the two negative and positive full-scale ends.

Section 3G—Description of FIG. 3G

FIG. 3G, including an upper-graph, a middle-graph, and a lower-graph, is a SPICE circuit simulation showing the input-output and linearity waveforms of the multi-quadrant digital input to analog current output multiplier (qiMULT$_{3b}$) of FIG. 3B in section 3B.

The input current signals $\pm E_{3b}$ and $\pm F_{3b}$ of qiMULT$_{3b}$ of FIG. 3B are marked as $I_E$ and $I_F$, respectively, in the lower-graph of FIG. 3G. The $\pm E_{3b}$ and $\pm F_{3b}$ digital input signals (i.e., $I_E$ and $I_F$) are ramped up and down, respectively, between negative-full-scale (indicated as −1 on the vertical axis of lower-graph of FIG. 3G) and positive-full-scale (indicated as +1 on the vertical axis of lower-graph of FIG. 3G). The zero-scale is depicted as 0 point on the vertical axis of the lower-graph of FIG. 3G. Also, an ideal multiplication result $Io_{ideal}=I_E \times I_F/I_R$ is plotted and marked in the lower-graph of FIG. 3G, wherein $I_R$ is the reference current signal $G_{3b}$. Note that for clarity of illustration, Io$_{ideal}$ is plotted with small offset to avoid graphical overlap with Io$_{sim}$.

Moreover, Io$_{sim}$ that is the output signal of qiMULT$_{3b}$ of FIG. 3B in section 3B is also plotted in the lower-graph of FIG. 3G. The output signal of qiMULT$_{3b}$ is a SPICE circuit simulation in the lower-graph of FIG. 3G that graphs Io$_{sim}$ which represents the simulated multi-quadrant product output current signal $\pm E_{3b} \times \pm F_{3b}/G_{3b}$ of FIG. 3B.

The middle-graph of FIG. 3G is a plot of power supply current consumption ($I_{DD}$). Note that the iMULT$_{3b}$ utilized in this simulation operates in the subthreshold region which contributes to ultra-low $I_{DD}$ spanning from about −200 nA to −100 nA, depending on $I_E$ and $I_F$ values.

The upper-graph of FIG. 3G is a plot of the linearity error in % of full scale that is the difference between the Io$_{ideal}$ and Io$_{sim}$, which is the output current signal of the qiMULT$_{3b}$ simulated results. The linearity error in % is plotted with positive power supply ($V_{DD}$) ranging from $V_{DD}$=1v to $V_{DD}$=0.8v to $V_{DD}$=0.7v, which indicates performance to specification in sub-1V power supply conditions, while the input signals $I_E$ and $I_F$ span between positive to negative full-scale ranges. Note that the single-quadrant CMOS iMULT$_{3b}$ of FIG. 3B that operates in the subthreshold region simulations indicates a linearity of about 1% (note that the single-quadrant CMOS iMULT$_{3b}$ is not shown by itself). As shown in the upper-graph of FIG. 3G is a plot of the linearity error in % of the multi-quadrant analog input to analog current output multiplier (qiMULT$_{3d}$) also peaks to about 1% (adjusted for iMULT$_{3b}$'s gain error) between the two negative and positive full-scale ends.

Section 4A—Description of FIG. 4A

FIG. 4A illustrates a multiple-channel multi-quadrant analog current-input to current-output scalar multiplier (SqiMULT$_{4a}$)

As stated earlier, SqiMULT$_{4A}$ of FIG. 4A utilizes plurality of qiMULT$_{3b}$ illustrated earlier in FIG. 3B and disclosed in section 3B. Additionally, refer to section 3G and FIG. 3G which is a circuit simulation describing and illustrating the input-output waveforms of the qiMULT$_{3b}$ of FIG. 3B that is utilized here in FIG. 4A.

In the disclosed SqiMULT$_{4a}$ of FIG. 4A, an E bipolar current input signal ($\pm E_{4a}$ that is a scalar signal) is inputted to an E current signal conditioner (iSCE$_{4a}$). The iSCE$_{4a}$ can utilize a modified version of the circuit embodiment such as iSC$_{1a}$ that is disclosed in section 1A. To facilitate multiplying a scalar signal $\pm E_{4a}$ to a plurality of signals (e.g., p=3 as in three channels $\pm F1_{4a}$, $\pm F2_{4a}$, $\pm F3_{4a}$), the iSC$_{1a}$ of FIG. 1A can be re-arranged with three additional same size FETs in parallel with M4$_{1a}$ to generate three replicates of |E$_{4a}$|. The iSCE$_{4a}$ also generates an E sign signal (eS$_{4a}$), which indicates the polarity of the $\pm E_{4a}$.

Note that number of channels can be a sea of channels (plurality>2) depending on the end-application, but for descriptive clarity, 3-channels are illustrated and describe here.

In the first channel, a F1 bipolar current input signal ($\pm F1_{4a}$) is inputted to a F1 current signal conditioner (iSCH$_{4a}$). Moreover, the iSCH$_{4a}$ can utilize a circuit embodiment such as iSC$_{1a}$ that is disclosed in section 1A and illustrated in FIG. 1A. The iSCH$_{4a}$ generate a F1 unipolar current signal (|F1$_{4a}$|). The iSCH$_{4a}$ also generates a F1 sign signal (fS1$_{4a}$), which indicates the polarity of the $\pm F1_{4a}$. Then, a single-quadrant current multiplier (iMULT1$_{4a}$) is inputted with the |F1$_{4a}$| and the (scalar signal which is the) unipolar current signals |E$_{4a}$|. Accordingly, the iMULT1$_{4a}$ generates a single-quadrant (unipolar) product current signal that represents |E$_{4a}$|×|F1$_{4a}$|/G$_{4a}$, wherein G$_{4a}$ is a reference current signal. Next, the single-quadrant product current signal |E$_{4a}$|×|F1$_{4a}$|/G$_{4a}$ is inputted to a current-mode polarity conditioner (iPC1$_{4a}$). The iPC1$_{4a}$ can utilize a circuit embodiment such as iPC$_{1e}$ that is disclosed in section 1E and illustrated in FIG. 1E. The iPC1$_{4a}$ is also inputted with the E and F1 sign signals, eS$_{4a}$ and fS1$_{4a}$, and it generates a multi-quadrant product current signal that represents $\pm E_{4a} \times \pm F1_{4a}/G_{4a}$.

In the second channel, a F2 bipolar current input signal ($\pm F2_{4a}$) is inputted to a F2 current signal conditioner (iSCF2$_{4a}$). Moreover, the iSCF2$_{4a}$ can utilize a circuit embodiment such as iSC$_{1a}$ that is disclosed in section 1A and illustrated in FIG. 1A. The iSCF2$_{14a}$ generate a F2 unipolar current signal (|F2$_{4a}$|). The iSCF2$_{4a}$ also generates a F2 sign signal (fS2$_{4a}$), which indicates the polarity of the $\pm F2_{4a}$. Then, a single-quadrant current multiplier (iMULT2$_{4a}$) is inputted with the |F2$_{4a}$| and the (scalar signal which is the) unipolar current signals |E$_{4a}$|. Accordingly, the iMULT2$_{4a}$ generates a single-quadrant (unipolar) product current signal that represents |E$_{4a}$|×|F2$_{4a}$|/G$_{4a}$, wherein G$_{4a}$ is a reference current signal. Next, the single-quadrant product current signal |E$_{4a}$|×|F2$_{4a}$|/G$_{4a}$ is inputted to a current-mode polarity conditioner (iPC2$_{4a}$). The iPC2$_{4a}$ can utilize a circuit embodiment such as iPC$_{1e}$ that is disclosed in section 1E and illustrated in FIG. 1E. The iPC2$_{4a}$ is also inputted with the E and F2 sign signals, eS$_{4a}$ and fS2$_{4a}$, and it generates a multi-quadrant product current signal that represents $\pm E_{4a} \times \pm F2_{4a}/G_{4a}$.

In the third channel, a F3 bipolar current input signal ($\pm F3_{4a}$) is inputted to a F3 current signal conditioner (iSCF3$_{4a}$). Moreover, the iSCF3$_{4a}$ can utilize a circuit embodiment such as iSC$_{1a}$ that is disclosed in section 1A and illustrated in FIG. 1A. The iSCF3$_{14a}$ generate a F3 unipolar current signal (|F3$_{4a}$|). The iSCF3$_{4a}$ also generates a F3 sign signal (fS3$_{4a}$), which indicates the polarity of the $\pm F3_{4a}$. Then, a single-quadrant current multiplier (iMULT3$_{4a}$) is inputted with the |F3$_{4a}$| and the (scalar signal which is the) unipolar current signals |E$_{4a}$|. Accordingly, the iMULT3$_{4a}$ generates a single-quadrant (unipolar) product current signal that represents |E$_{4a}$|×|F3$_{4a}$|/G$_{4a}$, wherein G$_{4a}$ is a reference current signal. Next, the single-quadrant product current signal |E$_{4a}$|×|F3$_{4a}$|/G$_{4a}$ is inputted to a current-mode polarity conditioner (iPC3$_{4a}$). The iPC3$_{4a}$ can utilize a circuit embodiment such as iPC$_{1e}$ that is disclosed in section 1E and illustrated in FIG. 1E. The iPC3$_{4a}$ is also inputted with the E and F3 sign signals, eS$_{4a}$ and fS3$_{4a}$, and it generates a multi-quadrant product current signal that represents $\pm E_{4a} \times \pm F3_{4a}/G_{4a}$.

The disclosed SqiMULT$_{4a}$ of FIG. 4A operates in current mode and as such it possesses the relevant benefits listed earlier in the DETAILED DESCRIPTION section. Moreover, as compared to a more complicated, bigger, and slower multi-quadrant current mode multiplier, the disclosed method utilizes a simpler, smaller, and faster single-quadrant multiplier (combined with front-end signal conditioning and back-end polarity conditioning) to preform multi-quadrant multiplication. Additionally, matching between the plurality of channel outputs is improved since identical arrangements for iPC1$_{4a}$-iPC2$_{4a}$-iPC3$_{4a}$, and identical arrangements for iMULT1$_{4a}$-iMULT2$_{4a}$-iMULT3$_{4a}$, and identical arrangements for iSCE$_{4a}$-iSCH$_{4a}$-iSCF2$_{4a}$-iSCF3$_{4a}$ can be utilized in SqiMULT$_{4a}$.

Section 4B—Description of FIG. 4B

FIG. 4B illustrates a multiple-channel multi-quadrant digital-input to current-output scalar multiplier (SqiMULT$_{4b}$).

As stated earlier, SqiMULT$_{4b}$ of FIG. 4B utilizes plurality of qiMULT$_{3c}$ illustrated earlier in FIG. 3C and disclosed in section 3C. Please refer to section 3E and FIG. 3E which is a circuit simulation describing and illustrating the input-output waveforms of the qiMULT$_{3c}$ of FIG. 3C that is utilized here in FIG. 4B.

In the disclosed SqiMULT$_{4b}$ of FIG. 4B, an E digital-input signal ($\pm E_{4b}$), which is m bits wide, is inputted to an E digital signal conditioner (dSCE$_{4b}$), which operates in sign-magnitude method. Note that $\pm E_{4b}$ is the scalar signal that can be multiplied with plurality of signals (e.g., $\pm F1_{4b}$, $\pm F2_{4b}$, $\pm F3_{4b}$, and so on), which will be described shortly. As stated earlier, besides the sign-magnitude method, it would be obvious to one skilled in the art to utilize other digital binary formatting methods, including but not limited to, 2's complement, 1's complement, and offset-binary, amongst others. The dSCE$_{4b}$ can utilize a circuit embodiment such as dSC'$_{1b}$ that is disclosed in section 1B and illustrated in FIG. 1B. The dSCE$_{4b}$ generates a magnitude E digital signal (|E$_{4b}$|), which is m−1 bits wide. The dSCE$_{4b}$ also generates an E digital sign signal (eS$_{4b}$), which indicates the polarity of the $\pm E_{4b}$, which is the MSB of the $\pm E_{4b}$ digital signal here. An E single-quadrant iDACE$_{4b}$ receives a reference current signal G$_{4b}$ at its' current reference port RefE$_{4b}$. The

21 iDACE$_{4b}$ receives the E magnitude digital signals |E$_{4b}$| at its digital input port DiE$_{4b}$, and generates an E analog unipolar current signal |E'$_{4b}$| at its current output port (AoE$_{4b}$). The unipolar current signal |E'$_{4b}$| can be replicated (e.g., via a current mirror) plurality of instances (e.g., p=3) to provide the scalar signal (|E'$_{4b}$|) to be multiplied with plurality of signals (e.g., |F1'$_{4b}$|, |F2'$_{4b}$|, and |F3'$_{4b}$|), which will be described next.

Note that number of channels can be a sea of channels (plurality >2) depending on the end-application, but for clarity's sake 3-channels are illustrated and describe here.

In the first channel, a F1 digital input signal that is m-bits wide (±F1$_{4b}$) is inputted to a F1 digital signal conditioner (dSCF1$_{4b}$). The dSCF1$_{4b}$ can utilize a circuit embodiment such as dSC$_{1b}$ that is disclosed in section 1B and illustrated in FIG. 1B. The dSCF1$_{4b}$ generate a magnitude digital signal (|F1$_{4b}$|), which is m−1 bits wide. The dSCF1$_{4b}$ also generates a sign signal (fS1$_{4b}$) that is the MSB of the ±F1$_{4b}$ digital signal, which indicates the polarity of the digital input signal ±F1$_{4b}$. Concurrently, the current signal |E'$_{4b}$| from iDACE$_{4b}$'s output is inputted to a current reference port RefF1$_{4b}$ of a single-quadrant iDACF1$_{4b}$. The magnitude digital signal |F1$_{4b}$| is inputted to the digital input port DiF1$_{4b}$ of the iDACF1$_{4b}$, which generates an analog unipolar current signal at iDACF1$_{4b}$'s current output port (AoF1$_{4b}$). This signal at AoF1$_{4b}$ port represents |E'$_{4b}$|×|F1'$_{4b}$|/G$_{4b}$, wherein G$_{4b}$ is a reference current signal. Next, the unipolar product current signal |E'$_{4b}$|×|F1'$_{4b}$|/G$_{4b}$ is inputted to a current-mode polarity conditioner (iPC1$_{4b}$). The iPC1$_{4b}$ can utilize a circuit embodiment such as iPC$_{1e}$ that is disclosed in section 1E and illustrated in FIG. 1E. The iPC1$_{4b}$ also receives the E and F1 sign signals, eS$_{4b}$ and fS1$_{4b}$, and accordingly generates a multi-quadrant product current signal that represents ±E'$_{4b}$×±F1'$_{4b}$/G$_{4b}$.

In the second channel, a F2 digital input signal that is m-bits wide (±F2$_{4b}$) is inputted to a F2 digital signal conditioner (dSCF2$_{4b}$). The dSCF2$_{4b}$ can also utilize a circuit embodiment such as dSC$_{1b}$ that is disclosed in section 1B and illustrated in FIG. 1B. The dSCF2$_{4b}$ generate a magnitude digital signal (|F2$_{4b}$|), which is m−1 bits wide. The dSCF2$_{4b}$ also generates a sign signal (fS2$_{4b}$) that is the MSB of the ±F2$_{4b}$ digital signal, which indicates the polarity of the digital input signal ±F2$_{4b}$. Concurrently, the current signal |E'$_{4b}$| from iDACE$_{4b}$'s output is inputted to a current reference port RefF2$_{4b}$ of a single-quadrant iDACF2$_{4b}$. The magnitude digital signal |F2$_{4b}$| is inputted to the digital input port DiF2$_{4b}$ of the iDACF2$_{4b}$, which generates an analog unipolar current signal at iDACF2$_{4b}$'s current output port (AoF2$_{4b}$). This signal at AoF2$_{4b}$ port represents I$_{4b}$×|F2'$_{4b}$|/G$_{4b}$, wherein G$_{4b}$ is a reference current signal. Next, the unipolar product current signal |E'$_{4b}$|×|F2'$_{4b}$|/G$_{4b}$ is inputted to a current-mode polarity conditioner (iPC2$_{4b}$). The iPC2$_{4b}$ can utilize a circuit embodiment such as iPC$_{1e}$ that is disclosed in section 1E and illustrated in FIG. 1E. The iPC2$_{4b}$ also receives the E and F2 sign signals, eS$_{4b}$ and fS2$_{4b}$ and generates a multi-quadrant product current signal that represents ±E'$_{4b}$×±F2'$_{4b}$/G$_{4b}$.

In the third channel, a F3 digital input signal that is m-bits wide (±F3$_{4b}$) is inputted to a F3 digital signal conditioner (dSCF3$_{4b}$). The dSCF3$_{4b}$ can also utilize a circuit embodiment such as dSC$_{1b}$ that is disclosed in section 1B and illustrated in FIG. 1B. The dSCF3$_{4b}$ generate a magnitude digital signal (|F3$_{4b}$|), which is m−1 bits wide. The dSCF3$_{4b}$ also generates a sign signal (fS3$_{4b}$) that is the MSB of the ±F3$_{4b}$ digital signal, which indicates the polarity of the digital input signal ±F3$_{4b}$. Concurrently, the current signal |E'$_{4b}$| from iDACE$_{4b}$ 's output is also inputted to a current

22 reference port RefF3$_{4b}$ of a single-quadrant iDACF3$_{4b}$. The magnitude digital signal |F3$_{4b}$| is inputted to the digital input port DiF3$_{4b}$ of the iDACF3$_{4b}$, which generates an analog unipolar current signal at iDACF3$_{4b}$'s current output port (AoF3$_{4b}$). This signal at AoF3$_{4b}$ port represents |E'$_{4b}$|×|F3'$_{4b}$|/G$_{4b}$, wherein G$_{4b}$ is a reference current signal. Next, the unipolar product current signal |E'$_{4b}$|×|F3'$_{4b}$|/G$_{4b}$ is inputted to a current-mode polarity conditioner (iPC3$_{4b}$). The iPC3$_{4b}$ can also utilize a circuit embodiment such as iPC$_{1e}$ that is disclosed in section 1E and illustrated in FIG. 1E. The iPC3$_{4b}$ also receives the E and F3 sign signals, eS$_{4b}$ and fS3$_{4b}$ and generates a multi-quadrant product current signal that represents ±E'$_{4b}$×±F3'$_{4b}$/G$_{4b}$.

The disclosed SqiMULT$_{4b}$ of FIG. 4B operates in current mode and as such it possesses the relevant benefits listed earlier in the DETAILED DESCRIPTION section. Also, as compared to a more complicated, bigger, and slower multi-quadrant current mode multiplier, the disclosed method utilizes a simpler, smaller, and faster single-quadrant multiplier (combined with front-end signal conditioning and back-end polarity conditioning) to preform multi-quadrant multiplication. Moreover, matching between the plurality of channel outputs is improved since identical arrangements for iPC1$_{4b}$-iPC2$_{4b}$-iPC3$_{4b}$, and identical arrangements for iDACE$_{4b}$-iDACF1$_{4b}$-iDACF2$_{4b}$-iDACF3$_{4b}$ can be utilized in SqiMULT$_{4a}$.

Section 4C—Description of FIG. 4C

FIG. 4C illustrates another multiple-channel multi-quadrant analog current-input to current-output scalar multiplier (SqiMULT$_{4c}$).

As stated earlier, SqiMULT$_{4c}$ of FIG. 4C utilizes plurality of qiMULT$_{3c}$ illustrated earlier in FIG. 3D and disclosed in section 3D. Also refer to section 3F and FIG. 3F which is a circuit simulation describing and illustrating the input-output waveforms of the qiMULT$_{3d}$ of FIG. 3D that is utilized here in FIG. 4C.

In the disclosed SqiMULT$_{4c}$ of FIG. 4C, a bipolar E analog current-input signal (±E$_{4c}$) is inputted to an E analog signal conditioner (iSCE$_{4c}$). Note that ±E$_{4c}$ is the scalar signal that can be multiplied with plurality of signals (e.g., ±F1$_{4c}$, ±F2$_{4c}$, ±F3$_{4c}$, and so on), which will be discussed shortly. The iSCE$_{4c}$ can utilize a circuit embodiment such as iSC$_{1a}$ that is disclosed in section 1A and illustrated in FIG. 1A. The iSCE$_{4C}$ generates a unipolar analog current signal (|E$_{4c}$|). The iSCE$_4$, also generates an E digital sign signal (eS$_{4c}$), which indicates the polarity of the ±E$_{4c}$. An E single-quadrant iADCE$_{4b}$ receives a reference current signal G$_{4c}$ at its' current reference port RefE$_{4c}$. The iADCE$_{4C}$ receives the E unipolar analog current signal |E$_{4b}$| at its analog input port AiE$_{4c}$, and generates an E digital signal |E'$_{4c}$| that is m−1 bits wide at its digital output port (DoE$_{4c}$). The iADCE$_{4c}$'s digital output signal |E'$_4$| can be inputted to a plurality channels (e.g., p=3) to be multiplied with plurality of signals (e.g., |F1$_{4c}$|, |F2$_{4c}$|, and |F3$_{4c}$|), which will be described next.

Note that number of channels can be a sea of channels (plurality>2) depending on the end-application requirements, but for clarity of description, 3-channels are illustrated and describe here.

In the first channel, a F1 bipolar analog current-input signal (±F1$_{4c}$) is inputted to a F1 analog signal conditioner (iSCH$_{4c}$). The iSCH$_{4c}$ can utilize a circuit embodiment such as iSC$_{1a}$ that is disclosed in section 1A and illustrated in FIG. 1A. The iSCH$_{4c}$ generate a unipolar analog current signal (|F1$_{4c}$|). The iSCH$_{4c}$ also generates a sign signal (fS1$_{4c}$), which indicates the polarity of ±F1$_{4c}$. The iADCE$_{4c}$'s digital output signal |E'$_{4c}$| is inputted to the digital input port DiF1$_{4c}$ of a single-quadrant iDACF1$_{4c}$. Concurrently, the unipolar analog current signal |F1$_{4c}$| is inputted to the iDACF1$_{4c}$'s current reference port RefF1$_{4c}$. Accordingly, the iDACF1$_{4c}$ generates (at its current output port AoF1$_{4c}$) a unipolar analog current signal that represents |E$_{4c}$|×|F1$_{4c}$|/G$_{4c}$, wherein G$_{4c}$ is a reference current signal. Next, the unipolar product current signal |Ez$_{4c}$|×|F1$_{4c}$|/G$_{4c}$ is inputted to a current-mode polarity conditioner (iPC1$_{4c}$). The iPC1$_{4c}$ can utilize a circuit embodiment such as iPC$_{1e}$ that is disclosed in section 1E and illustrated in FIG. 1E. The iPC1$_{4c}$ also receives the E and F1 sign signals, eS$_{4c}$ and fS1$_{4c}$, and it generates a multi-quadrant product current signal that represents ±E$_{4c}$×±F1$_{4c}$/G$_{4c}$.

In the second channel, a F2 bipolar analog current-input signal (±F2$_{4c}$) is inputted to a F2 analog signal conditioner (iSCF2$_{4c}$). The iSCF2$_{4c}$ can also utilize a circuit embodiment such as iSC$_{1a}$ that is disclosed in section 1A and illustrated in FIG. 1A. The iSCF2$_{4c}$ generate a unipolar analog current signal (|F2$_{4c}$|). The iSCF2$_{4c}$ also generates a sign signal (fS2$_{4c}$), which indicates the polarity of ±F2$_{4c}$. The iADCE$_{4c}$'s digital output signal |E'$_{4c}$| is also inputted to the digital input port DiF2$_{4c}$ of a single-quadrant iDACF2$_{4C}$. Concurrently, the unipolar analog current signal |F2$_{4c}$| is inputted to the iDACF2$_{4c}$'s current reference port RefF2$_{4c}$. Accordingly, the iDACF2$_{4c}$ generates (at its current output port AoF2$_{4c}$) a unipolar analog current signal that represents |E$_{4c}$|×|F2$_{4c}$|/G$_{4c}$, wherein G$_{4c}$ is a reference current signal. Next, the unipolar product current signal |E$_{4c}$|×|F2$_{4c}$|/G$_{4c}$ is inputted to a current-mode polarity conditioner (iPC2$_{4c}$). The iPC2$_{4c}$ can also utilize a circuit embodiment such as iPC$_{1e}$ that is disclosed in section 1E and illustrated in FIG. 1E. The iPC2$_{4c}$ also receives the E and F2 sign signals, eS$_{4c}$ and fS2$_{4c}$, and it generates a multi-quadrant product current signal that represents ±E$_{4c}$×±F2$_{4c}$/G$_{4c}$.

In the third channel, a F3 bipolar analog current-input signal (±F3$_{4c}$) is inputted to a F3 analog signal conditioner (iSCF3$_{4C}$). The iSCF3$_{4C}$ can also utilize a circuit embodiment such as iSC$_{1a}$ that is disclosed in section 1A and illustrated in FIG. 1A. The iSCF3$_{4C}$ generate a unipolar analog current signal (|F3$_{4c}$|). The iSCF3$_{4c}$ also generates a sign signal (fS3$_{4c}$), which indicates the polarity of ±F3$_{4c}$. The iADCE$_{4c}$'s digital output signal |E'L$_{4c}$| is also inputted to the digital input port DiF3$_{4c}$ of a single-quadrant iDACF3$_{4C}$. Concurrently, the unipolar analog current signal |F3$_{4c}$| is inputted to the iDACF3$_{4c}$'s current reference port RefF3$_{4c}$. Accordingly, the iDACF3$_{4C}$ generates (at its current output port AoF3$_{4c}$) a unipolar analog current signal that represents |E$_{4c}$|×|F3$_{4c}$|/G$_{4c}$, wherein G$_{4c}$ is a reference current signal. Next, the unipolar product current signal |E$_{4c}$|×|F3$_{4c}$|/G$_{4c}$ is inputted to a current-mode polarity conditioner (iPC3$_{4c}$). The iPC3$_{4c}$ can also utilize a circuit embodiment such as iPC$_{1e}$ that is disclosed in section 1E and illustrated in FIG. 1E. The iPC3$_{4c}$ also receives the E and F3 sign signals, eS$_{4c}$ and fS3$_{4c}$, and it generates a multi-quadrant product current signal that represents ±E$_{4c}$×±F3$_{4c}$/G$_{4c}$.

The disclosed SqiMULT$_{4c}$ of FIG. 4C operates in current mode and as such it possesses the relevant benefits listed earlier in the DETAILED DESCRIPTION section. Also, as compared to a more complicated, bigger, and slower multi-quadrant current mode multiplier, the disclosed method utilizes a simpler, smaller, and faster single-quadrant multiplier (combined with front-end signal conditioning and back-end polarity conditioning) to preform multi-quadrant multiplication. Furthermore, matching between the plurality of channel outputs is improved since identical arrangements for iPC1$_4$-iPC2$_4$-iPC3$_{4c}$, and identical arrangements for DACF1$_{4c}$-iDACF2$_{4c}$-iDACF3$_{4c}$, and identical arrangements for iSCE$_{4c}$-iSCH$_{4c}$-iSCF2$_{4c}$-iSCF3$_{4c}$ can be utilized in SqiMULT$_{4c}$.

Figure 4D:
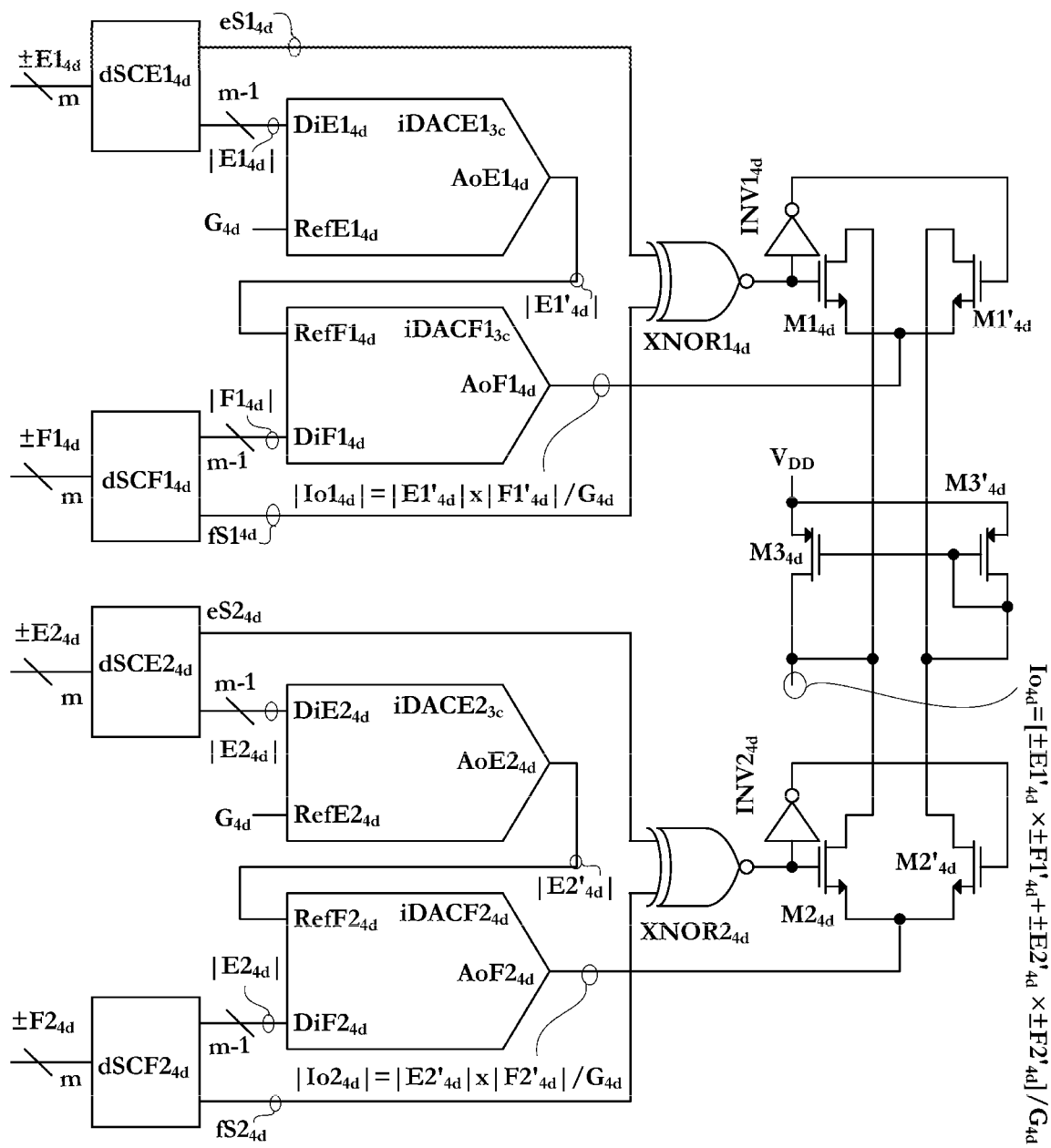
FIG. 4D is a simplified block diagram illustrating a multi-quadrant digital input to analog current output multiply-accumulate ($qiMAC_{4d}$) utilizing $qiMULT_{3c}$ illustrated in FIG. 3D.

Section 4D—Description of FIG. 4D

FIG. 4D is a simplified block diagram illustrating a multi-quadrant digital input to analog current output multiply-accumulate (qiMAC$_{4d}$) utilizing qiMULT$_{3c}$ disclosed in section 3C.

Note that qiMAC$_{4d}$ utilizes plurality of qiMULT$_{3c}$ illustrated earlier in FIG. 3C and disclosed in section 3C. Also refer to section 3E and FIG. 3E which is a circuit simulation describing and illustrating the input-output waveforms of the qiMULT$_{3c}$ of FIG. 3C that is utilized here in FIG. 4D.

In the disclosed qiMAC$_{4d}$ of FIG. 4D, an E1 digital input signal (±E1$_{4d}$), which is m bits wide, is inputted to an E1 digital signal conditioner (dSCE1$_{4d}$), which operates in sign-magnitude method. As stated earlier, besides the sign-magnitude method, it would be obvious to one skilled in the art to utilize other digital binary formatting methods, including but not limited to, 2's complement, 1's complement, and offset-binary, amongst others. The dSCE1$_{4d}$ can utilize a circuit embodiment such as dSC$_{1b}$ that is disclosed in section 1B and illustrated in FIG. 1B. The dSCE1$_{4d}$ generates a magnitude E1 digital signal (|E1$_{4d}$|), which is m−1 bits wide. The dSCE1$_{4d}$ also generates an E1 digital sign signal (eS1$_{4d}$), which indicates the polarity of the ±E1$_{4d}$, which is the MSB of the ±E1$_{4d}$ digital signal.

Similarly, a F1 digital input signal that is m-bits wide (±F1$_{4d}$) is inputted to a F1 digital signal conditioner (dSCF1$_{4d}$). Also, the dSCF1$_{4d}$ can utilize a circuit embodiment such as dSC$_{1b}$ that is disclosed in section 1B and illustrated in FIG. 1B. The dSCF1$_{4d}$ generate a magnitude F1 digital signal (|F1$_{4d}$|), which is m−1 bits wide. The dSCF1$_{4d}$ also generates a F1 sign signal (fS1$_{4d}$), which indicates the polarity of the ±F1$_{4d}$, which is the MSB of the ±F1$_{4d}$ digital signal.

Then, the |E1$_{4d}$| and |F1$_{4d}$| magnitude digital signals are inputted to a pair of single-quadrant iDACs configured in multiplying DAC mode, as follows: An E1 single-quadrant iDACE1$_{4d}$ receives a reference current signal G$_{4d}$ at its' current reference port RefE1$_{4d}$. The iDACE1$_{4d}$ receives the E1 magnitude digital signals |E1$_{4d}$| at its digital input port DiE1$_{4d}$, and generates an E1 analog unipolar current signal |E1'$_{4d}$| at its current output port (AoE1$_{4d}$). Concurrently, a F1 single-quadrant iDACF1$_{4d}$ receives, as its reference current signal, the |E1'$_{4d}$| from iDACE1$_{4d}$ at iDACF1$_{4d}$'s current reference port RefF1$_{4d}$. The iDACF1$_{4d}$ receives the F1 magnitude digital signals |F1$_{4d}$| at its digital input port DiF1$_{4d}$, and generates a F1 analog unipolar current signal at its current output port (AoF1$_{4d}$). This signal at the AoF1$_{4d}$ is an analog single-quadrant (unipolar) product current signal representing |E1'$_{4d}$|×|F1'$_{4d}$|/G$_{4d}$, wherein G$_{4d}$ is a reference current signal.

The single-quadrant product current signal |E1'$_{4d}$|×|F'$_{4d}$|/G$_{4d}$ is inputted to a current-mode polarity conditioning accumulator (iPCA$_{4d}$), which will be discussed shortly.

Additionally, in the disclosed qiMAC$_{4d}$ of FIG. 4D, an E2 digital input signal (±E2$_{4d}$), which is m bits wide, is inputted to an E2 digital signal conditioner (dSCE2$_{4d}$), which operates in sign-magnitude method. The dSCE2$_{4d}$ can utilize a circuit embodiment such as dSC$_{1b}$ that is disclosed in section 1B and illustrated in FIG. 1B. The dSCE2$_{4d}$ generates a magnitude E2 digital signal (|E2$_{4d}$|), which is m−1 bits wide. The dSCE2$_{4d}$ also generates an E2 digital sign signal ($eS2_{4d}$), which indicates the polarity of the $\pm E2_{4d}$, which is the MSB of the $\pm E2_{4d}$ digital signal.

Similarly, a F2 digital input signal that is m-bits wide ($\pm F2_{4d}$) is inputted to a F2 digital signal conditioner ($dSCF2_{4d}$). Also, the $dSCF2_{4d}$ can utilize a circuit embodiment such as $dSC_{1b}$ that is disclosed in section 1B and illustrated in FIG. 1B. The $dSCF2_{4d}$ generate a magnitude F2 digital signal ($|F2_{4d}|$), which is m−1 bits wide. The $dSCF2_{4d}$ also generates a F2 sign signal ($fS2_{4d}$), which indicates the polarity of the $\pm F2_{4d}$, which is the MSB of the $\pm F2_{4d}$ digital signal.

Likewise, the $|E2_{4d}|$ and $|F2_{4d}|$ magnitude digital signals are inputted to a pair of single-quadrant iDACs configured in multiplying DAC mode, as follows: An E2 single-quadrant $iDACE2_{4d}$ also receives a reference current signal $G_{4d}$ at its' current reference port $RefE2_{4d}$. The $iDACE2_{4d}$ receives the E2 magnitude digital signals $E2_{4d}|$ at its digital input port $DiE2_{4d}$, and generates an E2 analog unipolar current signal $|E2'_{4d}|$ at its current output port ($AoE2_{4d}$). Concurrently, a F2 single-quadrant $iDACF2_{4d}$ receives, as its reference current signal, the $|E2'_{4d}|$ from $iDACE2_{4d}$ at $iDACF2_{4d}$'s current reference port $RefF2_{4d}$. The $iDACF2_{4d}$ receives the F2 magnitude digital signals $|F2_{4d}|$ at its digital input port $DiF2_{4d}$, and generates a F2 analog unipolar current signal at its current output port ($AoF2_{4d}$). This signal at the $AoF2_{4d}$ is an analog single-quadrant (unipolar) product current signal representing $|E2'_{4d}|\times|F2'_{4d}|/G_{4d}$, wherein similarly $G_{4d}$ is a reference current signal.

The single-quadrant product current signal $|E2'_{4d}|\times|F2'_{4d}|/G_{4d}$ is inputted to the current-mode polarity conditioning accumulator ($iPCA_{4d}$), which is described next: The $iPCA_{4d}$ performs the equivalent function of a pair of modified $iPC_{1e}$s disclosed in section 1E and illustrated in FIG. 1E, wherein $M3_{1e}$ and $M4_{1e}$ are eliminated from $iPC_{1e}$. In the $iPCA_{4d}$ of FIG. 4d, sign signals $eS1_{4d}$ and $fS1_{4d}$ are inputted to $XNOR1_{4d}$. The analog single-quadrant (unipolar) product current signal representing $Io1_{4d}=E1'_{4d}\times|F1'_{4d}|/G_{4d}$ is inputted to the source terminals of $M1_{4d}$ and $M1'_{4d}$. Here, the $Io1_{4d}$ is steered either through $M1_{4d}$ to sink current from $Io_{4d}$ port (which is the current output port of the $qiMAC_{4d}$) or flow through $M1'_{4d}$ to the current mirror $M3'_{4d}$ and $M3_{4d}$ to source current through the $Io_{4d}$ port. Similarly, in the $iPCA_{4d}$ of FIG. 4d, sign signals $eS2_{4d}$ and $fS2_{4d}$ are inputted to $XNOR2_{4d}$. The analog single-quadrant (unipolar) product current signal representing $Io2_{4d}=|E2'_{4d}|\times|F2'_{4d}|/G_{4d}$ is inputted to the source terminals of $M2_{4d}$ and $M2'_{4d}$. Here, the $Io2_{4d}$ is steered either through $M2_{4d}$ to sink current from $Io_{4d}$ port, which is the current output port of the $qiMAC_{4d}$, or flow through $M2'_{4d}$ to the same current mirror $M3'_{4d}$ and $M3_{4d}$ to source current through the $Io_{4d}$ port. Accordingly, the output of $qiMAC_{4d}$ generates a $Io_{4d}=(\pm E1'_{4d}\times\pm F1'_{4d}\pm\pm E2'_{4d}\times\pm F2'_{4d})/G_{4d}$ Note that for clarity of description, the $qiMAC_{4d}$ is illustrated with 2 channels, but there can be (plurality) sea of channels, depending on end-application requirements.

Moreover, by sharing the same current mirror $M3_{4d}$ $M3'_{4d}$ amongst plurality of channels (besides smaller area and lower cost), the matching between each of the plurality of channel's current output is improved. Additionally, for enhanced multi-quadrant matching and faster dynamic performance, just one high-performance current mirror instead of plurality of current mirrors can be utilized (e.g., improved current mirror $M3_{4d}$-$M3'_{4d}$ such as cascading the mirror for higher output impedance and multi-quadrant matching, adding constant injection currents to input-output of the current mirror to improve its dynamic performance during zero-current crossing, etc.)

The disclosed $qiMAC_{4d}$ of FIG. 4D operates in current mode and as such it possesses the relevant benefits listed earlier in the DETAILED DESCRIPTION section. Furthermore, as compared to a more complicated, bigger, and slower multi-quadrant current mode multiplier, the disclosed method utilizes a simpler, smaller, and faster single-quadrant multiplier (combined with front-end signal conditioning and back-end polarity conditioning) to preform multi-quadrant multiplication. Moreover, matching between the plurality of channel outputs is improved since identical arrangements for $DACE1_{4d}$-$iDACF1_{4d}$ and $DACE2_{4d}$-$iDACF2_{4d}$ can be utilized in $qiMAC_{4d}$.

Figure 5A:
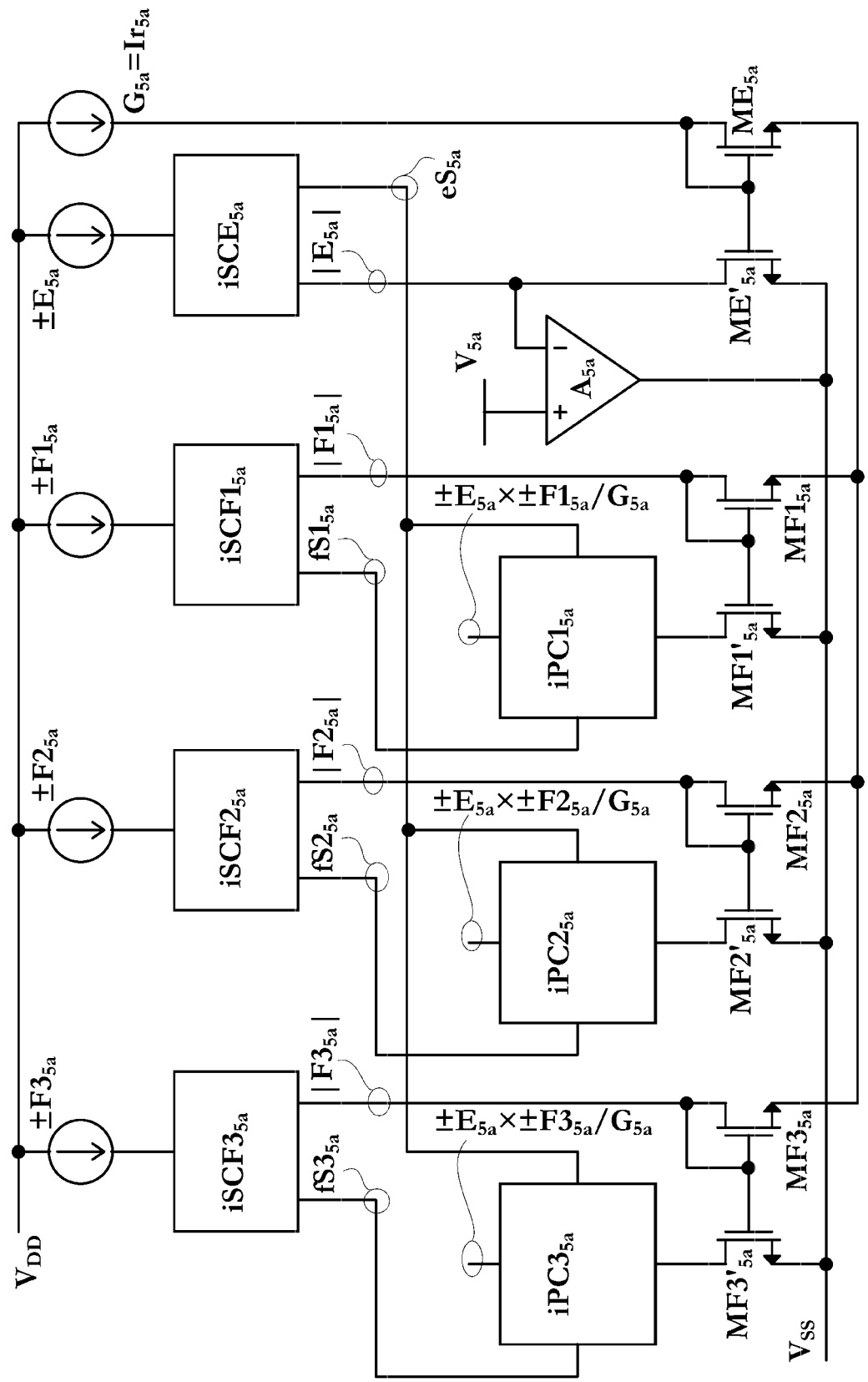
FIG. 5A illustrates another multiple-channel multi-quadrant analog current-input to current-output scalar multiplier ($SqiMULT_{5a}$)

Section 5A—Description of FIG. 5A

FIG. 5A illustrates another multiple-channel multi-quadrant analog current-input to current-output scalar multiplier ($SqiMULT_{5a}$)

First, the (unipolar) single-quadrant current-input to current-output multiplier section of $SqiMULT_{5a}$ is briefly described. By utilizing MOSFETs in subthreshold, a scalar current signal $I_{ME'_{5a}}$ and a reference current signal $Ir_{5a}=I_{ME_{5a}}$ establish a $$Vgs_{ME'_{5a}} - Vgs_{ME_{5a}} \approx n \times V_t \times \ln\left[\frac{I_{ME'_{5a}}}{I_{ME_{5a}}}\right].$$

By the operation of (Kirchhoff Voltage Law) KVL for the loop (comprising of $Vgs_{ME_{5a}}$, $Vgs_{ME'_{5a}}$, $Vgs_{MF1_{5a}}$, and $Vgs_{MF1'_{5a}}$) the difference voltage signal $Vgs_{ME'_{5a}}-Vgs_{ME_{5a}}$ is equalized with the difference voltage signal $Vgs_{MF1'_{5a}}-Vgs_{MF1_{5a}}$. As such, $$n \times V_t \times \ln\left[\frac{I_{ME'_{5a}}}{I_{ME_{5a}}}\right]$$

is substantially equalized with $$n \times V_t \times \ln\left[\frac{I_{MF1'_{5a}}}{I_{MF1_{5a}}}\right].$$

Hence, $I_{MF1'_{5a}}\approx I_{ME'_{5a}}\times I_{MF1_{5a}}/I_{ME_{5a}}$, which formulates the (unipolar) single-quadrant scalar multiplication of the first channel. Similar analysis can be applied to the second and third channels: $Vgs_{ME'_{5a}}-Vgs_{ME_{5a}}\approx Vgs_{MF2'_{5a}}-Vgs_{MF2_{5a}}$, and $Vgs_{ME'_{5a}}-Vgs_{ME_{5a}}\approx Vgs_{MF3'_{5a}}-Vgs_{MF3_{5a}}$. Therefore, $I_{MF2'_{5a}}\approx I_{ME'_{5a}}\times I_{MF2_{5a}}/I_{ME_{5a}}$, and $I_{MF3'_{5a}}\approx I_{ME'_{5a}}\times I_{MF3_{5a}}/I_{ME_{5a}}$.

In FIG. 5A, an E bipolar current input signal ($\pm E_{5a}$) is inputted to a E current signal conditioner ($iSCE_{5a}$). The $iSCE_{5a}$ can utilize a circuit embodiment such as $iSC_{1a}$ that is disclosed in section 1A and illustrated in FIG. 1A. The $iSCE_{5a}$ generate a E unipolar current signal ($|E_{5a}|=I_{ME'_{5a}}$). The $iSCE_{5a}$ also generates a E sign signal ($eS_{5a}$), which indicates the polarity of the $\pm E_{5a}$.

Substituting for $I_{ME_{5a}}=G_{5a}$, and $I_{ME'_{5a}}=|E_{5a}|$, hence $I_{MF1'_{5a}}\approx|E_{5a}|\times I_{MF1_{5a}}/G_{5a}$, $I_{MF2'_{5a}}\approx|E_{5a}|\times I_{MF2_{5a}}/G_{5a}$, and $I_{MF3'_{5a}}\approx|E_{5a}|\times I_{MF3_{5a}}/G_{5a}$.

Note also that number of channels can be a sea of channels (plurality>2) depending on the end-application, but for clarity of description, 3-channels are illustrated and describe here.

In FIG. 5A's first channel, a F1 bipolar current input signal ($\pm F1_{5a}$) is inputted to a F1 current signal conditioner (iSCH$_{5a}$). Moreover, the iSCH$_{5a}$ can utilize a circuit embodiment such as iSC$_{1a}$ that is disclosed in section 1A and illustrated in FIG. 1A. The iSCH$_{5a}$ generate a F1 unipolar current signal ($|F1_{5a}|=I_{MF1_{5a}}$) The iSCH$_{5a}$ also generates a F1 sign signal (fS1$_{5a}$), which indicates the polarity of the $\pm F1_{4a}$. Substituting for $|F1_{5a}|=I_{MF1_{5a}}$ in the multiplier equation derived above: $I_{MF1'_{5a}} \approx |E_{5a}| \times I_{MF1_{5a}}/G_{5a} \approx |E_{5a}| \times |F1_{5a}|/G_{5a}$. Next, the single-quadrant product current signal $|E_{5a}| \times |F1_{5a}|/G_{5a}$ is inputted to a current-mode polarity conditioner (iPC1$_{5a}$). The iPC1$_{5a}$ can likewise utilize a circuit embodiment such as iPC$_{1e}$ that is disclosed in section 1E and illustrated in FIG. 1E. The iPC1$_{5a}$ is also inputted with the E and F1 sign signals, eS$_{5a}$ and fS1$_{5a}$, and it generates a multi-quadrant product current signal that represents $\pm E_{5a} \times \pm F1_{5a}/G_{5a}$.

In FIG. 5A's second channel, a F2 bipolar current input signal ($\pm F2_{5a}$) is inputted to a F2 current signal conditioner (iSCF2$_{5a}$). Additionally, the iSCF2$_{5a}$ can utilize a circuit embodiment such as iSC$_{1a}$ that is disclosed in section 1A and illustrated in FIG. 1A. The iSCF2$_{5a}$ generate a F2 unipolar current signal ($|F2_{5a}|=I_{MF2_{5a}}$) The iSCF2$_{5a}$ also generate a F2 sign signal (fS2$_{5a}$), which indicates the polarity of the $\pm F2_{4a}$. Substituting for $|F2_{5a}|=I_{MF2_{5a}}$ in the multiplier equation derived above: $I_{MF2'_{5a}} \approx |E_{5a}| \times I_{MF2_{5a}}/G_{5a} \approx |E_{5a}| \times |F2_{5a}|/G_{5a}$. Next, the single-quadrant product current signal $|E_{5a}| \times |F2_{5a}|/G_{5a}$ is inputted to a current-mode polarity conditioner (iPC2$_{5a}$). The iPC2$_{5a}$ can also utilize a circuit embodiment such as iPC$_{1e}$ that is disclosed in section 1E and illustrated in FIG. 1E. The iPC2$_{5a}$ is also inputted with the E and F2 sign signals, eS$_{5a}$ and fS2$_{5a}$, and it generates a multi-quadrant product current signal that represents $\pm E_{5a} \times \pm F2_{5a}/G_{5a}$.

In FIG. 5A's third channel, a F3 bipolar current input signal ($\pm F3_{5a}$) is inputted to a F3 current signal conditioner (iSCF3$_{5a}$). Additionally, the iSCF3$_{5a}$ can utilize a circuit embodiment such as iSC$_{1a}$ that is disclosed in section 1A and illustrated in FIG. 1A. The iSCF3$_{5a}$ generate a F3 unipolar current signal ($|F3_{5a}|=I_{MF3_{5a}}$). The iSCF3$_{5a}$ also generates a F3 sign signal (fS3$_{5a}$), which indicates the polarity of the $\pm F3_{4a}$. Substituting for $|F3_{5a}|=I_{MF3_{5a}}$ in the multiplier equation derived above: $I_{MF3'_{5a}} \approx |E_{5a}| \times I_{MF3_{5a}}/G_{5a} \approx |E_{5a}| \times |F3_{5a}|/G_{5a}$. Next, the single-quadrant product current signal $|E_{5a}| \times |F3_{5a}|/G_{5a}$ is inputted to a current-mode polarity conditioner (iPC3$_{5a}$). The iPC3$_{5a}$ can also utilize a circuit embodiment such as iPC$_{1e}$ that is disclosed in section 1E and illustrated in FIG. 1E. The iPC3$_{5a}$ is likewise inputted with the E and F3 sign signals, eS$_{5a}$ and fS3$_{5a}$, and it generates a multi-quadrant product current signal that represents $\pm E_{5a} \times \pm F3_{5a}/G_{5a}$.

The disclosed SqiMULT$_{5a}$ of FIG. 5A operates in current mode and as such it possesses the relevant benefits listed earlier in the DETAILED DESCRIPTION section. Additionally, as compared to a more complicated, bigger, and slower multi-quadrant current mode multiplier, the disclosed method utilizes a simpler, smaller, and faster single-quadrant multiplier (combined with front-end signal conditioning and back-end polarity conditioning) to preform multi-quadrant multiplication. Furthermore, matching between the plurality of channel outputs is improved since identical arrangements for iSCE$_{5a}$–iSCF1$_{5a}$–iSCF2$_{5a}$–iSCF3$_{5a}$ and identical arrangements for iPC1$_{5a}$–iPC2$_{5a}$–iPC3$_{5a}$ can be utilized in SqiMULT$_{4d}$. Area savings and matching improvements are also attained in light of the multiplier FETs ME$_{5a}$ and ME'$_{5a}$ being shared amongst plurality of channels.

Figure 5B:
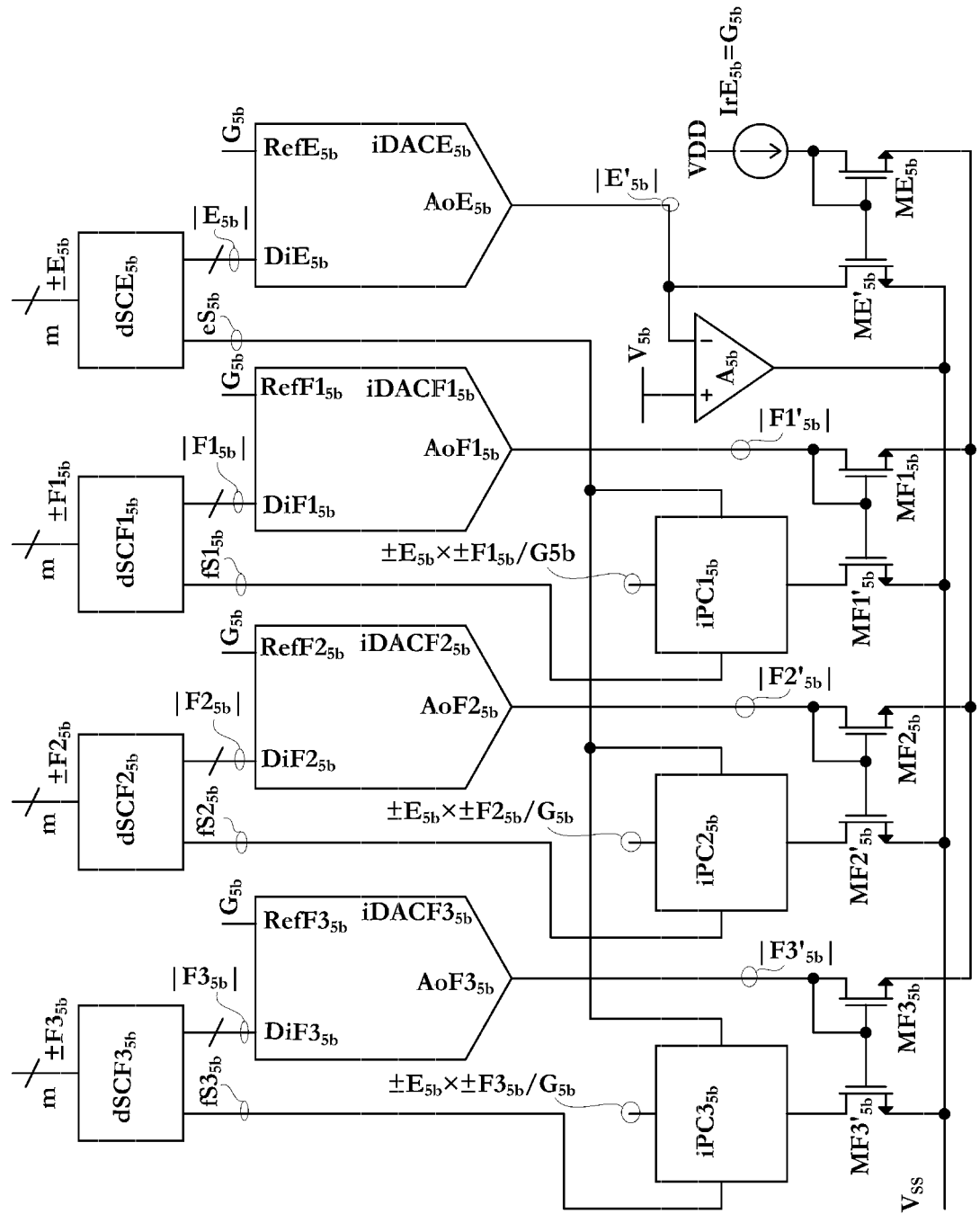
FIG. 5B illustrates another multiple-channel multi-quadrant digital-input to current-output scalar multiplier ($SqiMULT_{5b}$).

Section 5B—Description of FIG. 5B

FIG. 5B illustrates another multiple-channel multi-quadrant digital-input to current-output scalar multiplier (SqiMULT$_{5b}$)

First, the (unipolar) single-quadrant current-input to current-output multiplier section of SqiMULT$_{5b}$ is briefly described. Utilizing MOSFETs in subthreshold, a scalar current signal $I_{ME'_{5b}}$ and a reference current signal $Ir_{5b}=I_{ME_{5b}}$ establish a $$Vgs_{ME'_{5b}} - Vgs_{ME_{5b}} \approx n \times V_t \times \ln\left[\frac{I_{ME'_{5b}}}{I_{ME_{5b}}}\right].$$

By the operation of (Kirchhoff Voltage Law) KVL for the loop (comprising of Vgs$_{ME_{5b}}$, Vgs$_{ME'_{5b}}$, Vgs$_{MF1_{5b}}$, and Vgs$_{MF1'_{5b}}$) the difference voltage signal Vgs$_{ME'_{5b}}$–Vgs$_{ME_{5b}}$ is equalized with the difference voltage signal Vgs$_{MF1_{5b}}$–Vgs$_{MF1_{5b}}$. As such, $$n \times V_t \times \ln\left[\frac{I_{ME'_{5b}}}{I_{ME_{5b}}}\right]$$

is substantially equalized with $$n \times V_t \times \ln\left[\frac{I_{MF1'_{5b}}}{I_{MF1_{5b}}}\right].$$

Hence, $I_{MF1'_{5b}} \approx I_{ME'_{5b}} \times I_{MF1_{5b}}/I_{ME_{5b}}$, which formulates the (unipolar) single-quadrant scalar multiplication of the first channel. Similar analysis can be applied to the second and third channels: Vgs$_{ME'_{5b}}$–Vgs$_{ME_{5b}} \approx$ Vgs$_{MF2'_{5b}}$–Vgs$_{MF2_{5b}}$, and Vgs$_{ME'_{5b}}$–Vgs$_{ME_{5b}} \approx$ Vgs$_{MF3'_{5b}}$–Vgs$_{MF3_{5b}}$. Therefore, $I_{MF2'_{5b}} \approx I_{ME'_{5b}} \times I_{MF2_{5b}}/I_{ME_{5b}}$, and $I_{MF3'_{5b}} \approx I_{ME'_{5b}} \times I_{MF3_{5b}}/I_{ME_{5b}}$.

In the disclosed SqiMULT$_{5b}$ of FIG. 5B, an E digital-input signal ($\pm E_{5b}$), which is m bits wide, is inputted to an E digital signal conditioner (dSCE$_{5b}$), which operates in sign-magnitude method. As stated earlier, besides the sign-magnitude method, it would be obvious to one skilled in the art to utilize other digital binary formatting methods, including but not limited to, 2's complement, 1's complement, and offset-binary, amongst others. The dSCE$_{5b}$ can utilize a circuit embodiment such as dSC$_{1b}$ that is disclosed in section 1B and illustrated in FIG. 1B. The dSCE$_{5b}$ generates a magnitude E digital signal ($|E_{5b}|$), which is m−1 bits wide. The dSCE$_{5b}$ also generates an E digital sign signal (eS$_{5b}$), which indicates the polarity of the $\pm E_{5b}$, which is the MSB of the $\pm E_{5b}$ digital signal. An E single-quadrant iDACE$_{5b}$ receives a reference current signal $G_{5b}$ at its' current reference port RefE$_{5b}$. The iDACE$_{5b}$ receives the E magnitude digital signals $|E_{5b}|$ at its digital input port DiE$_{5b}$, and generates an E analog unipolar current signal $|E'_{5b}|$ at its current output port (AoE$_{5b}$).

Substituting for $I_{ME_{5b}}=G_{5b}$, and $I_{ME'_{5b}}=|E'_{5b}|$, hence $I_{MF1'_{5b}} \approx |E'_{5b}| \times I_{MF1_{5b}}/G_{5b}$, $I_{MF2'_{5b}} \approx |E'_{5b}| \times I_{MF2_{5b}}/G_{5b}$, and $I_{MF3'_{5b}} \approx |E'_{5b}| \times I_{MF3_{5b}}/G_{5b}$.

Note that number of channels can be a sea of channels (plurality>3) depending on the end-application, but for clarity's sake 3-channels are illustrated and describe here.

In FIG. 5B, for the disclosed SqiMULT$_{5b}$ first channel, a F1 digital-input signal (±F1$_{5b}$) that is m bits wide is inputted to an F1 digital signal conditioner (dSCF1$_{5b}$), which operates in sign-magnitude method. As stated earlier, besides the sign-magnitude method, it would be obvious to one skilled in the art to utilize other digital binary formatting methods, including but not limited to, 2's complement, 1's complement, and offset-binary, amongst others. The dSCF1$_{5b}$ can also utilize a circuit embodiment such as dSC$_{1b}$ that is disclosed in section 1B and illustrated in FIG. 1B. The dSCF1$_{5b}$ generates a magnitude F1 digital signal (|F1$_{5b}$|), which is m−1 bits wide. The dSCF1$_{5b}$ also generates an F1 digital sign signal (fS1$_{5b}$), which indicates the polarity of the ±F1$_{5b}$, which is the MSB of the ±F1$_{5b}$ digital signal. An F1 single-quadrant iDACF1$_{5b}$ receives a reference current signal G$_{5b}$ at its' current reference port RefF1$_{5b}$. The iDACF1$_{5b}$ receives the F1 magnitude digital signals |F1$_{5b}$| at its digital input port DiF1$_{5b}$, and generates an F1 analog unipolar current signal |F1'$_{5b}$| at its current output port (AoF1$_{5b}$). Substituting for |F1'$_{5b}$|=I$_{MF1_{5b}}$ in the multiplier equation derived above: I$_{MF1'_{5b}}$≈|E'$_{5b}$|×I$_{MF1_{5b}}$/G$_{5b}$≈|E'$_{5b}$|×|F1'$_{5b}$|/G$_{5b}$. Next, the single-quadrant product current signal |E'$_{5b}$|×|F1'$_{5b}$|/G$_{5b}$ is inputted to a current-mode polarity conditioner (iPC1$_{5b}$). The iPC1$_{5b}$ can likewise utilize a circuit embodiment such as iPC$_{1e}$ that is disclosed in section 1E and illustrated in FIG. 1E. The iPC1$_{5b}$ is also inputted with the E and F1 sign signals, eS$_{5b}$ and fS1$_{5b}$, and it generates a multi-quadrant product current signal that represents ±E'$_{5b}$×±F1$_{5b}$/G$_{5b}$.

In FIG. 5B, the disclosed SqiMULT$_{5b}$'s second channel, a F2 digital-input signal (±F2$_{5b}$) that is m bits wide is inputted to an F2 digital signal conditioner (dSCF2$_{5b}$), which operates in sign-magnitude method. The dSCF2$_{5b}$ can also utilize a circuit embodiment such as dSC$_{1b}$ that is disclosed in section 1B and illustrated in FIG. 1B. The dSCF2$_{5b}$ generates a magnitude F2 digital signal (|F2$_{5b}$|), which is m−1 bits wide. The dSCF2$_{5b}$ also generates an F2 digital sign signal (fS2$_{5b}$), which indicates the polarity of the ±F2$_{5b}$, which is the MSB of the ±F2$_{5b}$ digital signal. An F2 single-quadrant iDACF2$_{5b}$ receives a reference current signal G$_{5b}$ at its' current reference port RefF2$_{5b}$. The iDACF2$_{5b}$ receives the F2 magnitude digital signals |F2$_{5b}$| at its digital input port DiF2$_{5b}$, and it generates an F2 analog unipolar current signal |F2'$_{5b}$| at its current output port (AoF2$_{5b}$). Substituting for |F2'$_{5b}$|=I$_{MF2_{5b}}$ in the multiplier equation derived above: I$_{MF2'_{5b}}$≈E'$_{5b}$|×I$_{MF2_{5b}}$/G$_{5b}$≈|E'$_{5b}$|×|F2'$_{5b}$|/G$_{5b}$. Next, the single-quadrant product current signal |E'$_{5b}$|×|F2'$_{5b}$|/G$_{5b}$ is inputted to a current-mode polarity conditioner (iPC2$_{5b}$). The iPC2$_{5b}$ can likewise utilize a circuit embodiment such as iPC$_{1e}$ that is disclosed in section 1E and illustrated in FIG. 1E. The iPC2$_{5b}$ is also inputted with the E and F2 sign signals, eS$_{5b}$ and fS2$_{5b}$, and it generates a multi-quadrant product current signal that represents ±E'$_{5b}$×±F2'$_{5b}$/G$_{5b}$.

In the disclosed SqiMULT$_{5b}$'s third channel, a F3 digital-input signal (±F3$_{5b}$) that is m bits wide is inputted to an F3 digital signal conditioner (dSCF3$_{5b}$), which operates in sign-magnitude method. The dSCF3$_{5b}$ can also utilize a circuit embodiment such as dSC$_{1b}$ that is disclosed in section 1B and illustrated in FIG. 1B. The dSCF3$_{5b}$ generates a magnitude F3 digital signal (|F3$_{5b}$|), which is m−1 bits wide. The dSCF3$_{5b}$ also generates an F3 digital sign signal (fS3$_{5b}$), which indicates the polarity of the ±F3$_{5b}$, which is the MSB of the ±F3$_{5b}$ digital signal. A F3 single-quadrant iDACF3$_{5b}$ receives a reference current signal G$_{5b}$ at its' current reference port RefF3$_{5b}$. The iDACF3$_{5b}$ receives the F3 magnitude digital signals |F3$_{5b}$| at its digital input port DiF3$_{5b}$, and generates an F3 analog unipolar current signal |F3'$_{5b}$| at its current output port (AoF3$_{5b}$). Substituting for |F3'$_{5b}$|=I$_{MF3_{5b}}$ in the multiplier equation derived above: I$_{MF2'_{5b}}$≈|E'$_{5b}$|×I$_{MF3_{5b}}$/G$_{5b}$≈|E'$_{5b}$|×|F3'$_{5b}$|/G$_{5b}$. Next, the single-quadrant product current signal |E'$_{5b}$|×|F3'$_{5b}$|/G$_{5b}$ is inputted to a current-mode polarity conditioner (iPC3$_{5b}$). The iPC3$_{5b}$ can likewise utilize a circuit embodiment such as iPC$_{1e}$ that is disclosed in section 1E and illustrated in FIG. 1E. The iPC3$_{5b}$ is also inputted with the E and F3 sign signals, eS$_{5b}$ and fS3$_{5b}$, and it generates a multi-quadrant product current signal that represents ±E'$_{5b}$×±F3'$_{5b}$/G$_{5b}$.

The disclosed SqiMULT$_{5b}$ of FIG. 5B operates in current mode and as such it possesses the relevant benefits listed earlier in the DETAILED DESCRIPTION section. Furthermore, as compared to a more complicated, bigger, and slower multi-quadrant current mode multiplier, the disclosed method utilizes a simpler, smaller, and faster single-quadrant multiplier (combined with front-end signal conditioning and back-end polarity conditioning) to preform multi-quadrant multiplication. Additionally, matching between the plurality of channel outputs is improved since identical arrangements for iSCE$_{5b}$–iSCH$_{5b}$–iSCF2$_{5b}$–iSCF3$_{5b}$, and identical arrangements for iDACE$_{5b}$–iDACF1$_{5b}$–iDACF2$_{5b}$–iDACF3$_{5b}$, and identical arrangements for iPC1$_{5b}$–iPC2$_{5b}$–iPC3$_{5b}$ can be utilized in SqiMULT$_{5b}$. Area savings and matching improvements are also attained in light of the multiplier FETs ME$_{5b}$ and ME'$_{5b}$ being shared amongst plurality of channels.

What is claimed:

1. A mixed-signal current-mode multi-quadrant data-converter qDC system in an integrated circuit, the qDC system comprising:
   at least one qDAC of a plurality of bipolar digital-input to unipolar current analog-output converters (qDAC), each qDAC comprising:
      a digital signal conditioning circuit (dSC circuit) comprising a digital-input magnitude port (D$_{MAG}$ port) having a plurality of bits, a sign digital-input port (D$_{SIGN}$ port) that is 1-bit wide, and a digital output port (Dour port) having a plurality of bits;
      the dSC circuit comprising a plurality of Exclusive NOR gates (XNOR gates), each XNOR gate comprising a B digital-input port, (B$_{XNOR}$ port), a C digital-input port (C$_{XNOR}$ port), and a D digital-output port (D$_{XNOR}$ port);
      the B$_{XNOR}$ port of each XNOR gate of the plurality of XNOR gates coupled to the D$_{SIGN}$ port;
      the C$_{XNOR}$ port of each XNOR gate of the plurality of XNOR gates coupled to a corresponding bit of the D$_{MAG}$ port;
      the D$_{XNOR}$ port of each XNOR gate of the plurality of XNOR gates coupled to a corresponding bit of the D$_{OUT}$ port;
      a current mode Digital-to-Analog-Converter (iDAC) comprising a digital-input port (Di$_{DAC}$ port), a current analog-output port (Io$_{DAC}$ port), and a reference current analog-input port (Ir$_{DAC}$ port);
      the Di$_{DAC}$ port coupled to the D$_{XNOR}$ port;
      wherein the D$_{MAG}$ port and the D$_{SIGN}$ port comprise a bipolar digital-input port for receiving a bipolar digital input word (±W$_D$ word) having a digital Most-Significant-Bit (W$_{MSB}$ bit) corresponding to the D$_{SIGN}$ port and a unipolar magnitude digital word (|W$_D$| word) corresponding to the D$_{MAG}$ port; and wherein the $Io_{DAC}$ port generates a unipolar current analog-output signal ($|W_A|$ analog signal) that is responsive to a unipolar digital word ($|W_D|$ digital word) at the $Di_{DAC}$ port.

2. The mixed-signal current-mode multi-quadrant data-converter qDC system in an integrated circuit of claim 1, the qDC system further comprising:
the at least one qDAC further comprising:
an analog current-mode polarity conditioning circuit (iPC circuit) comprising a current analog-input port ($Ii_{PC}$ port), a sign control digital-input port ($Si_{PC}$ port), and a differential current analog-output port comprising an $Io+_{PC}$ port and an $Io-_{PC}$ port;
the $D_{SIGN}$ port of the qDAC coupled to the $Si_{PC}$ port;
the $Io_{DAC}$ port of the qDAC coupled to the $Ii_{PC}$ port; and
wherein if the $Si_{PC}$ port is asserted to an ON state, then a current signal flowing through the $Ii_{PC}$ port is steered onto the $Io+_{PC}$ port, else onto the $Io-_{PC}$ port.

3. The mixed-signal current-mode multi-quadrant data-converter qDC system in an integrated circuit of claim 2, the qDC system further comprising
a current mirror (CM) comprising an input port ($CM_I$ port) and an output port ($CM_O$ port);
the $Io+_{PC}$ port of the iPC circuit coupled to the $CM_O$ port;
the $Io+_{PC}$ port of the iPC circuit coupled to the $CM_I$ port; and
wherein a bipolar current analog-output signal ($\pm W_A$ signal) is generated at the $CM_O$ port that is equivalent to the $\pm W_D$ word.

4. The mixed-signal current-mode multi-quadrant data-converter qDC system in an integrated circuit of claim 1, the qDC system further comprising
wherein the at least one qDAC is a scalar qDAC;
an at least one current mirror (CM) comprising an input port ($CM_I$ port) and an at least one output port ($CM_O$ port);
the $Io_{DAC}$ port of the scalar qDAC coupled to the $CM_I$ port;
the at least one $CM_O$ port coupled to the $Ir_{DAC}$ port of an at least one other qDAC of the plurality of qDACs;
an at least one polarity XNOR gate (pXNOR gate) comprising a first digital-input port, a second digital-input port, and a digital-output port;
an at least one analog current-mode polarity conditioning circuit (iPC circuit) comprising a current analog-input port ($Ii_{PC}$ port), a sign control digital-input port ($Si_{PC}$ port), and a differential current analog-output port comprising an $Io+_{PC}$ port and an $Io-_{PC}$ port;
the $Io_{DAC}$ port of the at least one other qDAC coupled with the $Ii_{PC}$ port of the at least one iPC circuit;
the digital-output port of the at least one pXNOR gate coupled with the $Si_{PC}$ port of the at least one iPC circuit;
the $D_{SIGN}$ port of the of the at least one qDAC coupled to the first digital-input port of the at least one pXNOR gate; and
the $D_{SIGN}$ port of the of the scalar qDAC coupled to the second digital-input port of the at least one pXNOR gate.

5. The mixed-signal current-mode multi-quadrant data-converter qDC system in an integrated circuit of claim 1, the qDC system further comprising
a plurality of bipolar digital-input to unipolar current analog-output multipliers (qMULT multiplier), an at least one qMULT multiplier comprising:
an at least one first qDAC (EqDAC) of the plurality of qDACs;
an at least one second qDAC (FqDAC) of the plurality of qDACs;
an at least one XNOR gate (pXNOR gate) comprising a first digital-input port, a second digital-input port, and a digital-output port;
an at least one analog current-mode polarity conditioning circuit (iPC circuit) comprising a current analog-input port ($Ii_{PC}$ port), a sign control digital-input port ($Si_{PC}$ port), and a differential current analog-output port comprising an $Io+_{PC}$ port and an $Io-_{PC}$ port;
the $Io_{DAC}$ port of the iDAC of the at least one EqDAC coupled with the $Ir_{DAC}$ port of the iDAC of the at least one FqDAC;
the $Io_{DAC}$ port of the iDAC of the at least one FqDAC coupled with the $Ii_{PC}$ port of the at least one iPC circuit;
the $D_{SIGN}$ port of the dSC circuit of the at least one EqDAC coupled with the first digital-input port of the at least one pXNOR gate;
the $D_{SIGN}$ port of the dSC circuit of the at least one FqDAC, coupled with the second digital-input port of the at least one pXNOR gate;
the digital output port of the at least one pXNOR gate coupled with the $Si_{PC}$ port of the at least one iPC circuit; and
wherein if the $Si_{PC}$ port is asserted to an ON state, then a current signal flowing through the $Ii_{PC}$ port of the at least one iPC circuit is steered onto the $Io+_{PC}$ port of the at least one iPC circuit, else onto the $Io-_{PC}$ port of the at least one iPC circuit.

6. The mixed-signal current-mode multi-quadrant data-converter qDC system in an integrated circuit of claim 5, the qDC system further comprising
for the at least one iPC circuit of the at least one qMULT multiplier, the $Io+_{PC}$ port coupled to an I+ port;
for the at least one iPC circuit of the at least one qMULT multiplier, the $Io-_{PC}$ port coupled to an I- port;
an at least one analog current mirror (CM) comprising a current analog-input port ($CM_I$ port) and a current analog-output port ($CM_O$ port);
the I+ port coupled to the $CM_O$ port of the at least one CM;
the I- port coupled to the $CM_I$ port of the at least one CM; and
wherein an at least one bipolar summation current analog-output signal ($\pm\Sigma EF$ signal) is generated at the $CM_O$ port.

7. A mixed-signal current-mode multi-quadrant scalar multiplier SqMULT method in an integrated circuit, the SqMULT method comprising:
operating a plurality of transistors ($T_{LOG}$ transistor), each $T_{LOG}$ transistor having a logarithmic relationship between an input voltage analog port ($A_V$ port) of the $T_{LOG}$ transistor and an output current analog port ($A_I$ port) of the $T_{LOG}$ transistor;
operating a reference $T_{LOG}$ transistor ($Tr_{LOG}$ transistor), a scalar $T_{LOG}$ transistor ($Ts_{LOG}$ transistor), an at least one X $T_{LOG}$ transistor ($Tx_{LOG}$ transistor), and an at least one O $T_{LOG}$ transistor ($To_{LOG}$ transistor);
supplying a reference current ($I_R$ current) to the $A_I$ port of the $Tr_{LOG}$ transistor;
supplying a scalar current ($I_S$ current) to the $A_I$ port of the $Ts_{LOG}$ transistor;
supplying an at least one X current ($I_X$ current) to the $A_I$ port of an at least one $Tx_{LOG}$ transistor;

generating a difference voltage ($\Delta V_{S-R}$ voltage) between the $A_V$ port of the $Ts_{LOG}$ transistor and the $A_V$ port of the $Tr_{LOG}$ transistor;

generating a corresponding at least one difference voltage ($\Delta V_{O-X}$ voltage) between an at least one $A_V$ port of the at least one $To_{LOG}$ transistor and a corresponding at least one $A_V$ port of a corresponding at least one $Tx_{LOG}$ transistor; and generating a corresponding at least one O current ($I_O$ current) through an at least one $A_I$ port of a corresponding at least one $To_{LOG}$ transistor by substantially equalizing the $\Delta V_{S-R}$ voltage with the corresponding at least one $\Delta V_{O-X}$ voltage.

8. The mixed-signal current-mode multi-quadrant scalar multiplier SqMULT method in an integrated circuit of claim 7, the SqMULT method further comprising:

operating a plurality of iSC circuits, each iSC circuit receiving a bipolar current analog-input signal ($\pm W_A$ signal) and generating a unipolar current analog-output signal ($|W_A|$ signal) as a magnitude of the $\pm W_A$ signal, and generating a sign digital-output bit (S bit) as the sign of the $\pm W_A$ signal;

generating the $I_S$ current by a first $|W_A|$ signal ($|W_{AS}|$ signal) of a first S iSC circuit of the plurality of iSC circuits;

generating a first S bit ($S_S$ bit) of the first S iSC circuit of the plurality of iSC circuits;

generating the at least one $I_X$ current by a corresponding at least one $|W_A|$ signal ($|W_{AX}|$ signal) of a corresponding at least one X iSC circuit of the plurality of iSC circuits;

generating an at least one S bit ($S_X$ bit) of the corresponding at least one X iSC circuit of the plurality of iSC circuits;

generating a plurality of Io currents;

operating a plurality of iPC circuits, each iPC circuit corresponding to and receiving one of the Io currents into an $Ii_{PC}$ port of the corresponding iPC, steering the corresponding $I_O$ current from the $Ii_{PC}$ port onto an at least one of an $Io+_{PC}$ port and an $Io-_{PC}$ port of the corresponding iPC circuit responsive to a signal at an $Si_{PC}$ port of the corresponding iPC circuit, wherein each iPC circuit comprises a current analog-input port ($Ii_{PC}$ port), a sign control digital-input port ($Si_{PC}$ port), and a differential current analog-output port comprising an $Io+_{PC}$ port and an $Io-_{PC}$ port; and controlling the $Si_{PC}$ port of the corresponding iPC circuit by a logical combination of the corresponding at least one $S_X$ bit and the corresponding at least one $S_S$ bit.

9. The mixed-signal current-mode multi-quadrant scalar multiplier SqMULT method in an integrated circuit of claim 7, the SqMULT method further comprising:

operating a plurality of digital signal conditioning circuits (dSC circuit);

receiving a bipolar digital-input word ($\pm W_D$ word) into an at least one of a plurality of corresponding dSC circuits, and generating a unipolar digital-output word ($|W_D|$ word) as a magnitude of the $\pm W_D$ word, and generating a sign digital-output bit ($S_D$ bit) as a Most-Significant-Bit (MSB) of the $\pm W_D$ word;

operating a plurality of current-mode Digital-To-Analog-Converters (iDAC);

receiving a $|W_D|$ word of a corresponding dSC circuit into an at least one of a plurality of corresponding iDACs, and generating a current analog output signal ($|W_A|$ word);

generating a plurality of Io currents;

operating a plurality of iPC circuits, each iPC circuit corresponding to and receiving one of the Io currents into an $Ii_{PC}$ port of the corresponding iPC, steering the corresponding $I_O$ current from the $Ii_{PC}$ port onto an at least one of an $Io+_{PC}$ port and an $Io-_{PC}$ port of the corresponding iPC circuit responsive to a signal at an $Si_{PC}$ port of the corresponding iPC circuit, wherein each iPC circuit comprises a current analog-input port ($Ii_{PC}$ port), a sign control digital-input port ($Si_{PC}$ port), and a differential current analog-output port comprising an $Io+_{PC}$ port and an $Io-_{PC}$ port;

generating the $I_S$ current by a first $|W_A|$ signal ($|W_{AS}|$ signal) of a first S iDAC of a corresponding at least one S iDAC of the plurality of iDACs;

generating a first S bit ($S_D$ bit) of a first S dSC circuit of the plurality of dSC circuits;

generating the at least one $I_X$ current by a corresponding at least one $|W_A|$ signal ($|W_{AX}|$ signal) of a corresponding at least one iDAC of the plurality of iDACs;

generating an at least one S bit ($S_X$ bit) of a corresponding at least one X dSC circuit of the plurality of dSC circuits; and controlling a corresponding at least one $Si_{PC}$ port of a corresponding at least one iPC circuit of the plurality of the iPC circuits by logical combination of the corresponding at least one $S_X$ bit and the corresponding at least one $S_S$ bit.

10. The mixed-signal current-mode multi-quadrant scalar multiplier SqMULT method in an integrated circuit of claim 7, the SqMULT method further comprising:

wherein each $T_{LOG}$ of the plurality of $T_{LOGS}$ is at least one of a bipolar junction transistor ($T_{BJT}$) and a Metal-Oxide-Semiconductor-Field-Effect-Transistor ($T_{MOSFET}$);

wherein each $T_{BJT}$ having a collector terminal, a base terminal, and an emitter terminal, wherein the input port of the $T_{LOG}$ transistor is between the base terminal and the emitter terminal, constituting the voltage analog port ($A_V$ port), and the output port of the $T_{LOG}$ transistor is the collector terminal, constituting the current analog port ($A_I$ port); and wherein each $T_{MOSFET}$ having a drain terminal, a gate terminal, and a source terminal, wherein the input port of the $T_{LOG}$ transistor is between the gate terminal and the source terminal, constituting the voltage analog port ($A_V$ port), and the output port of the $T_{LOG}$ transistor is the drain terminal, constituting the current analog port ($A_I$ port).

* * * * *